US012330499B2

(12) United States Patent
Hofbauer et al.

(10) Patent No.: US 12,330,499 B2
(45) Date of Patent: Jun. 17, 2025

(54) APPARATUS COMPRISING A CARRIER WITH OPTOELECTRONIC ELEMENTS AND METHOD FOR MANUFACTURING THE APPARATUS

(71) Applicant: OSRAM Opto Semiconductors GmbH, Regensburg (DE)

(72) Inventors: Ludwig Hofbauer, Regenstauf (DE); Armin Wetterer, Regensburg (DE); Michael Wittmann, Alteglofsheim (DE); Hanna Schulz, Regensburg (DE); Sebastian Wittmann, Regenstauf (DE); Andreas Dobner, Wenzenbach (DE); Ulrich Frei, Regensburg (DE); Matthias Goldbach, Pentling (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 762 days.

(21) Appl. No.: 17/615,738

(22) PCT Filed: Oct. 29, 2020

(86) PCT No.: PCT/EP2020/080475
§ 371 (c)(1),
(2) Date: Dec. 1, 2021

(87) PCT Pub. No.: WO2021/110334
PCT Pub. Date: Jun. 10, 2021

(65) Prior Publication Data
US 2022/0289028 A1 Sep. 15, 2022

(30) Foreign Application Priority Data

Dec. 6, 2019 (DE) .................... 10 2019 133 449.7
Feb. 21, 2020 (DK) ............................ PA202070104
(Continued)

(51) Int. Cl.
B32B 3/10 (2006.01)
B32B 3/14 (2006.01)
(Continued)

(52) U.S. Cl.
CPC ................ B60K 35/00 (2013.01); B32B 3/10 (2013.01); B32B 3/14 (2013.01); B60K 35/22 (2024.01);
(Continued)

(58) Field of Classification Search
CPC .. B32B 3/085; B32B 3/10; B32B 3/14; B32B 3/18; B32B 3/22
See application file for complete search history.

(56) References Cited

U.S. PATENT DOCUMENTS 8,474,860 B2   7/2013 Ohoka et al.
8,924,076 B2  12/2014 Boote et al.
(Continued)

FOREIGN PATENT DOCUMENTS

CN   1675446 A    9/2005
CN   108877521 A  11/2018
(Continued)

OTHER PUBLICATIONS

International Search Report and Written Opinion issued in International Application No. PCT/EP2020/080475 on Mar. 2, 2021.
(Continued)

Primary Examiner — Elizabeth E Mulvaney
(74) Attorney, Agent, or Firm — ArentFox Schiff LLP

(57) ABSTRACT

An optoelectronic apparatus comprises a transparent first cover, at least two carriers mounted on the first cover, wherein a plurality of optoelectronic elements configured to emit light are attached to each of the at least two carriers, and a second cover mounted on the at least two carriers, wherein the second cover has at least partially a lower optical
(Continued)

transmittance than the first cover and/or the at least two carriers.

22 Claims, 17 Drawing Sheets

(30) Foreign Application Priority Data

Oct. 13, 2020 (DE) .................. 10 2020 126 792.4
Oct. 13, 2020 (DE) .................. 10 2020 126 793.2

(51) Int. Cl.
*B60K 35/00* (2006.01)
*B60K 35/22* (2024.01)
*B60K 35/60* (2024.01)

(52) U.S. Cl.
CPC ...... *B60K 35/60* (2024.01); *B60K 2360/1523* (2024.01); *B60K 2360/28* (2024.01); *B60K 2360/771* (2024.01); *B60K 2360/785* (2024.01); *B60K 2360/92* (2024.01)

(56) References Cited

U.S. PATENT DOCUMENTS

| | | | |
|---|---|---|---|
| 9,806,281 B2 | 10/2017 | Domercq et al. | |
| 10,395,589 B1 | 8/2019 | Vahid Far et al. | |
| 11,179,032 B2 | 11/2021 | Chen et al. | |
| 11,479,023 B2 | 10/2022 | Berard et al. | |
| 11,569,411 B2 | 1/2023 | Volpert | |
| 11,682,607 B2 | 6/2023 | We et al. | |
| 12,040,317 B2 * | 7/2024 | Brandl ............ | B60Q 9/00 |
| 2002/0118321 A1 | 8/2002 | Ge | |
| 2002/0140629 A1 | 10/2002 | Sundahl | |
| 2002/0149312 A1 | 10/2002 | Roberts et al. | |
| 2004/0185195 A1 | 9/2004 | Anderson et al. | |
| 2005/0238857 A1 | 10/2005 | Day | |
| 2005/0253244 A1 | 11/2005 | Chang | |
| 2006/0116046 A1 | 6/2006 | Morley et al. | |
| 2006/0275599 A1 | 12/2006 | Lefevre | |
| 2007/0014469 A1 | 1/2007 | Paillet et al. | |
| 2009/0016095 A1 | 1/2009 | Thomas et al. | |
| 2009/0021181 A1 | 1/2009 | Brune et al. | |
| 2009/0103298 A1 | 4/2009 | Boonekamp et al. | |
| 2009/0114928 A1 | 5/2009 | Messere et al. | |
| 2009/0231882 A1 | 9/2009 | Lin et al. | |
| 2009/0279295 A1 | 11/2009 | Van Der Poel | |
| 2009/0279558 A1 | 11/2009 | Davis et al. | |
| 2010/0060821 A1 | 3/2010 | Petersen et al. | |
| 2010/0140655 A1 | 6/2010 | Shi | |
| 2010/0176705 A1 | 7/2010 | Van Herpen et al. | |
| 2011/0006316 A1 | 1/2011 | Ing et al. | |
| 2011/0127552 A1 | 6/2011 | Van Herpen et al. | |
| 2011/0317417 A1 | 12/2011 | Gourlay | |
| 2013/0016494 A1 | 1/2013 | Speier et al. | |
| 2014/0091326 A1 | 4/2014 | Tran et al. | |
| 2014/0096893 A1 | 4/2014 | Veerasamy | |
| 2014/0234578 A1 | 8/2014 | Decraye et al. | |
| 2015/0239399 A1 | 8/2015 | Tonar et al. | |
| 2015/0253486 A1 | 9/2015 | Verger et al. | |
| 2015/0301175 A1 | 10/2015 | Rao et al. | |
| 2015/0308639 A1 | 10/2015 | Keranen et al. | |
| 2016/0154170 A1 | 6/2016 | Thompson et al. | |
| 2016/0313587 A1 | 10/2016 | Linthout et al. | |
| 2017/0005077 A1 | 1/2017 | Kim et al. | |
| 2017/0212633 A1 | 7/2017 | You et al. | |
| 2017/0301282 A1 | 10/2017 | Rotzoll et al. | |
| 2017/0309698 A1 | 10/2017 | Bower et al. | |
| 2017/0373268 A1 | 12/2017 | Takahashi et al. | |
| 2018/0141487 A1 | 5/2018 | Osumi et al. | |
| 2018/0301594 A1 | 10/2018 | Bouvier et al. | |
| 2018/0311935 A1 | 11/2018 | Sahyoun et al. | |
| 2018/0323180 A1 | 11/2018 | Cok | |
| 2018/0343741 A1 | 11/2018 | Williams et al. | |
| 2018/0345631 A1 | 12/2018 | Klein et al. | |
| 2018/0370195 A1 * | 12/2018 | Laluet ............ | G02B 27/0101 |
| 2018/0374834 A1 | 12/2018 | Tada et al. | |
| 2019/0001629 A1 | 1/2019 | Laluet | |
| 2019/0016095 A1 | 1/2019 | Labrot et al. | |
| 2019/0019968 A1 | 1/2019 | He et al. | |
| 2019/0096864 A1 | 3/2019 | Huitema et al. | |
| 2019/0134952 A1 | 5/2019 | Varanasi et al. | |
| 2019/0140154 A1 | 5/2019 | Ohmae et al. | |
| 2019/0160792 A1 | 5/2019 | Weber | |
| 2019/0172970 A1 | 6/2019 | Dupont et al. | |
| 2019/0193376 A1 | 6/2019 | Bauerle | |
| 2019/0248122 A1 | 8/2019 | Gillessen et al. | |
| 2019/0255813 A1 | 8/2019 | Bauerle et al. | |
| 2019/0279558 A1 | 9/2019 | Monestier et al. | |
| 2019/0299852 A1 | 10/2019 | Bauerle et al. | |
| 2019/0377125 A1 | 12/2019 | Liu et al. | |
| 2020/0006456 A1 | 1/2020 | Zhang et al. | |
| 2020/0012848 A1 | 1/2020 | Goto | |
| 2020/0144228 A1 | 5/2020 | Brick et al. | |
| 2020/0269815 A1 | 8/2020 | Day | |
| 2020/0350361 A1 | 11/2020 | Tao et al. | |
| 2022/0238497 A1 * | 7/2022 | Brandl ............ | B32B 17/10651 |

FOREIGN PATENT DOCUMENTS

| | | |
|---|---|---|
| CN | 109801568 A | 5/2019 |
| DE | 102007039416 A1 | 2/2009 |
| DE | 102012213343 A1 | 1/2014 |
| DE | 102013102003 A1 | 8/2014 |
| DE | 202015009229 U1 | 1/2017 |
| DE | 102017122852 A | 4/2019 |
| DE | 102018119376 A1 | 2/2020 |
| DE | 112018003398 T5 | 3/2020 |
| EP | 1760784 A2 | 3/2007 |
| EP | 1886804 A1 | 2/2008 |
| EP | 2412521 A1 | 2/2012 |
| EP | 2760108 A1 | 7/2014 |
| EP | 3264241 A1 | 1/2018 |
| EP | 3264242 A1 | 1/2018 |
| FR | 3044972 A1 | 6/2017 |
| JP | 08-130330 A | 5/1996 |
| JP | 10-240172 A | 9/1998 |
| JP | 2001-022300 A | 1/2001 |
| JP | 2003-337556 A | 11/2003 |
| JP | 2004-327955 A | 11/2004 |
| JP | 2005-310751 A | 11/2005 |
| JP | 2005-534612 A | 11/2005 |
| JP | 2007-073734 A | 3/2007 |
| JP | 2009-512977 A | 3/2009 |
| JP | 2009-535798 A | 10/2009 |
| JP | 2010-520627 A | 6/2010 |
| JP | 2010521353 A | 6/2010 |
| JP | 2010-170969 A | 8/2010 |
| JP | 2012-195404 A | 10/2012 |
| JP | 2014-060320 A | 4/2014 |
| JP | 2015-084374 A | 4/2015 |
| JP | 2016-167451 A | 9/2016 |
| JP | 2017-212384 A | 11/2017 |
| JP | 2019-009192 A | 1/2019 |
| JP | 2019-134025 A | 8/2019 |
| JP | 2020-017730 A | 1/2020 |
| KR | 10-2014-0071796 A | 6/2014 |
| WO | 2007093823 A1 | 8/2007 |
| WO | 2008058881 A1 | 5/2008 |
| WO | 2009087584 A1 | 7/2009 |
| WO | 2009125918 A2 | 10/2009 |
| WO | 2011158185 A1 | 12/2011 |
| WO | 2012/036081 A1 | 3/2012 |
| WO | 2014141019 A1 | 9/2014 |
| WO | 2014/178942 A1 | 11/2014 |
| WO | 201478942 A1 | 11/2014 |
| WO | 2016095117 A1 | 6/2016 |
| WO | 2018025051 A1 | 2/2018 |
| WO | 2019008493 A1 | 1/2019 |
| WO | 2019/026858 A1 | 2/2019 |
| WO | 2019048893 A1 | 3/2019 |
| WO | 2019091728 A1 | 5/2019 |

(56) References Cited

FOREIGN PATENT DOCUMENTS

| WO | 2019146634 A1 | 8/2019 |
| WO | 2019160199 A1 | 8/2019 |
| WO | 2019186513 A1 | 10/2019 |
| WO | 2020050062 A1 | 3/2020 |
| WO | 2020071815 A1 | 4/2020 |

OTHER PUBLICATIONS

Inernational Search Report and Written Opinion issued in International Patent Application No. PCT/EP2020/080474 on Apr. 13, 2021.

International Search Report and Written Opinion issued in International Patent Application No. PCT/EP2020/080473 on May 18, 2021.

\* cited by examiner

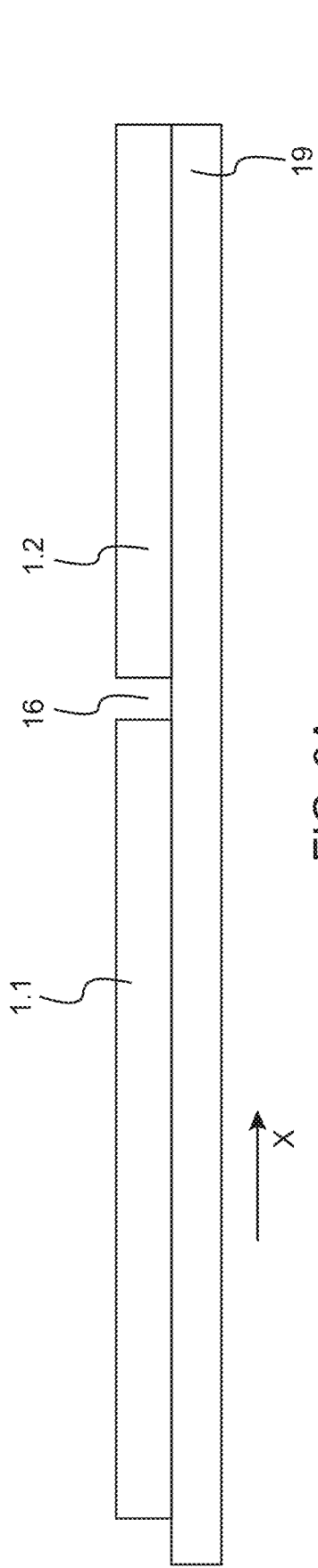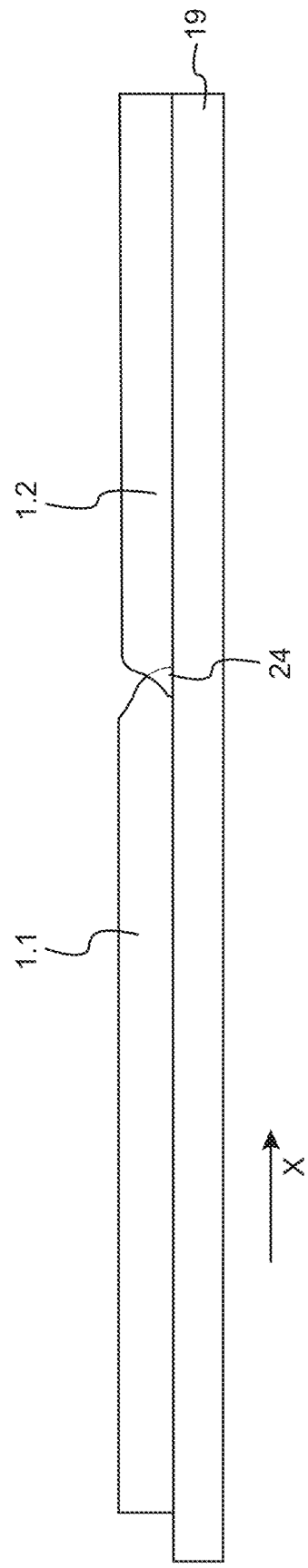

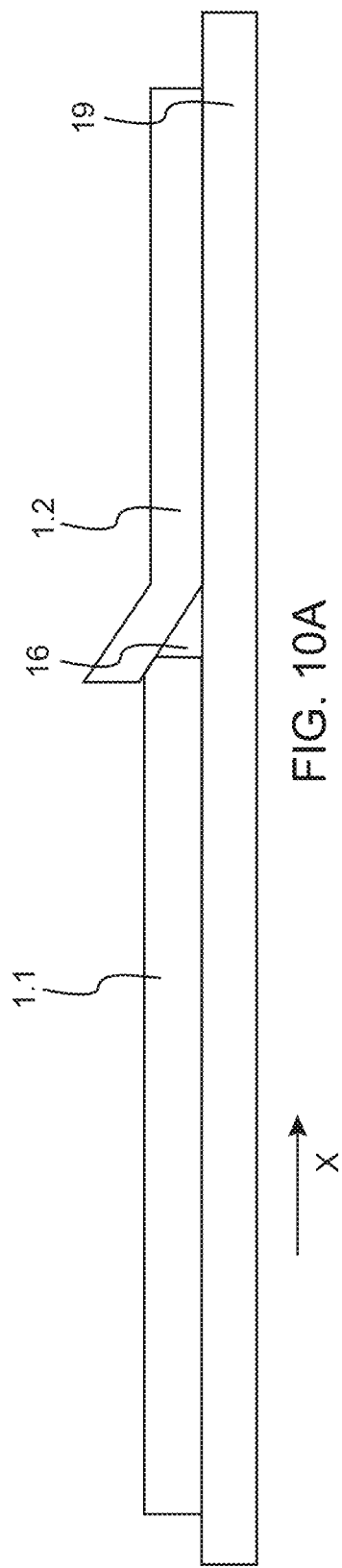
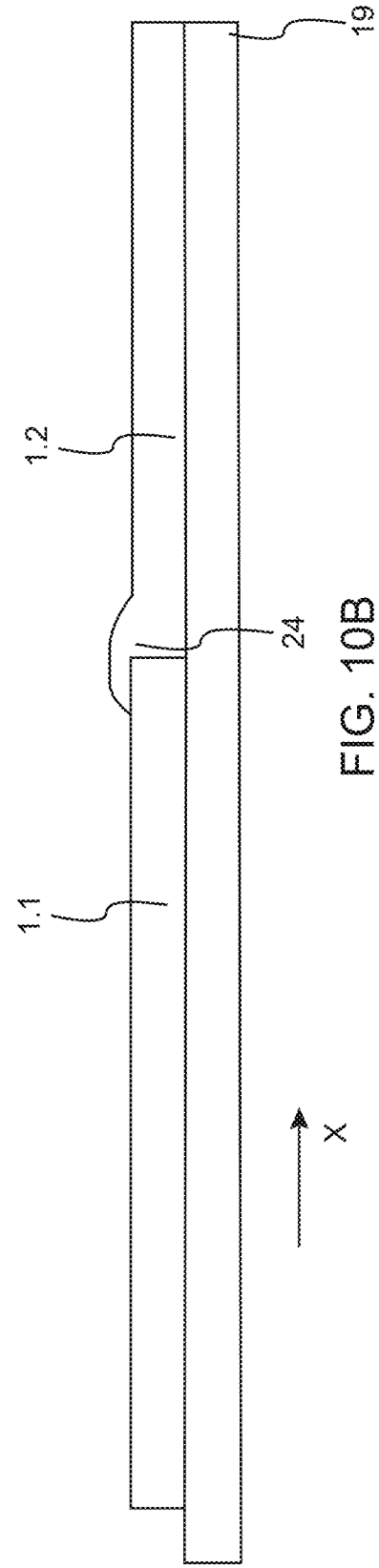

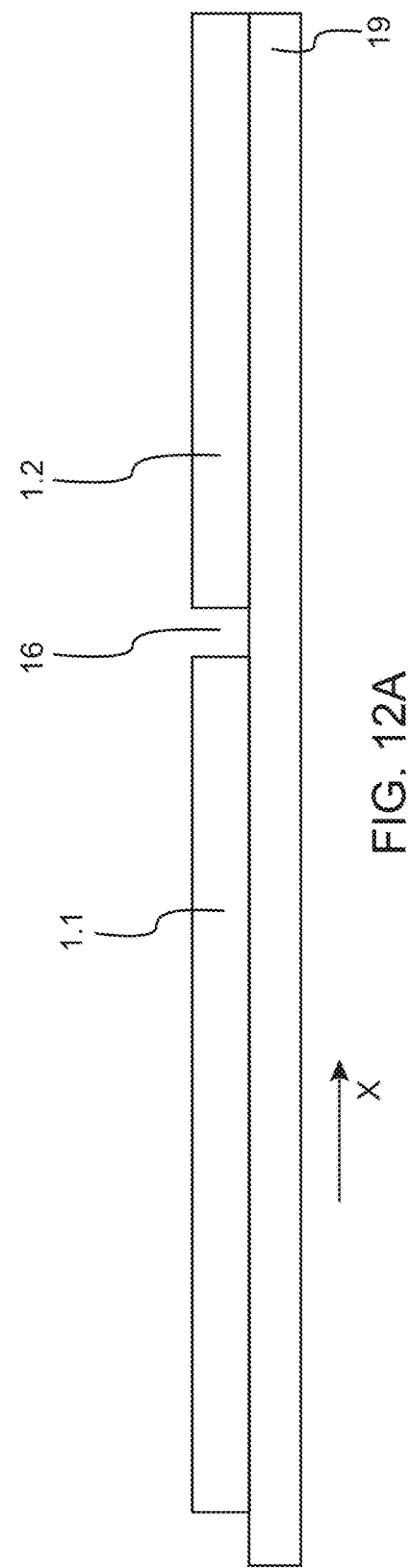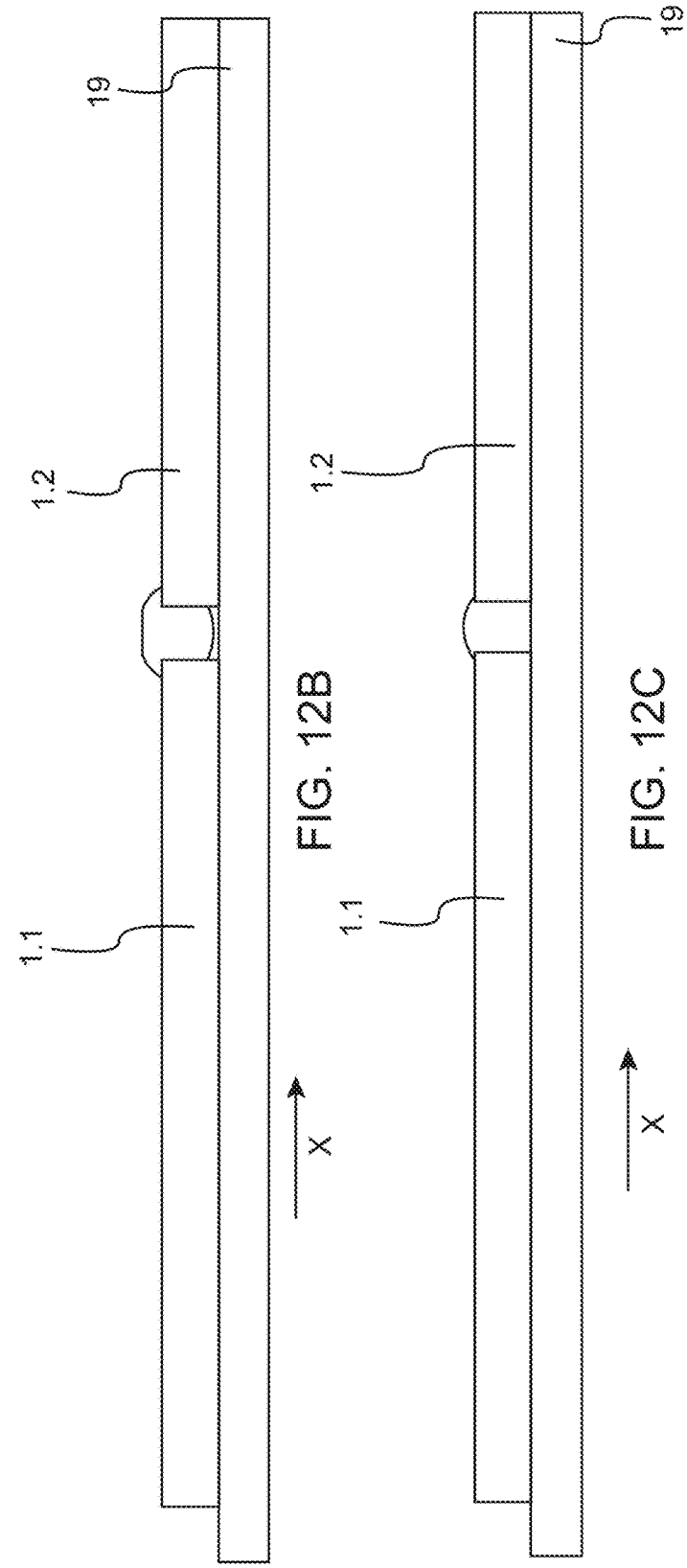

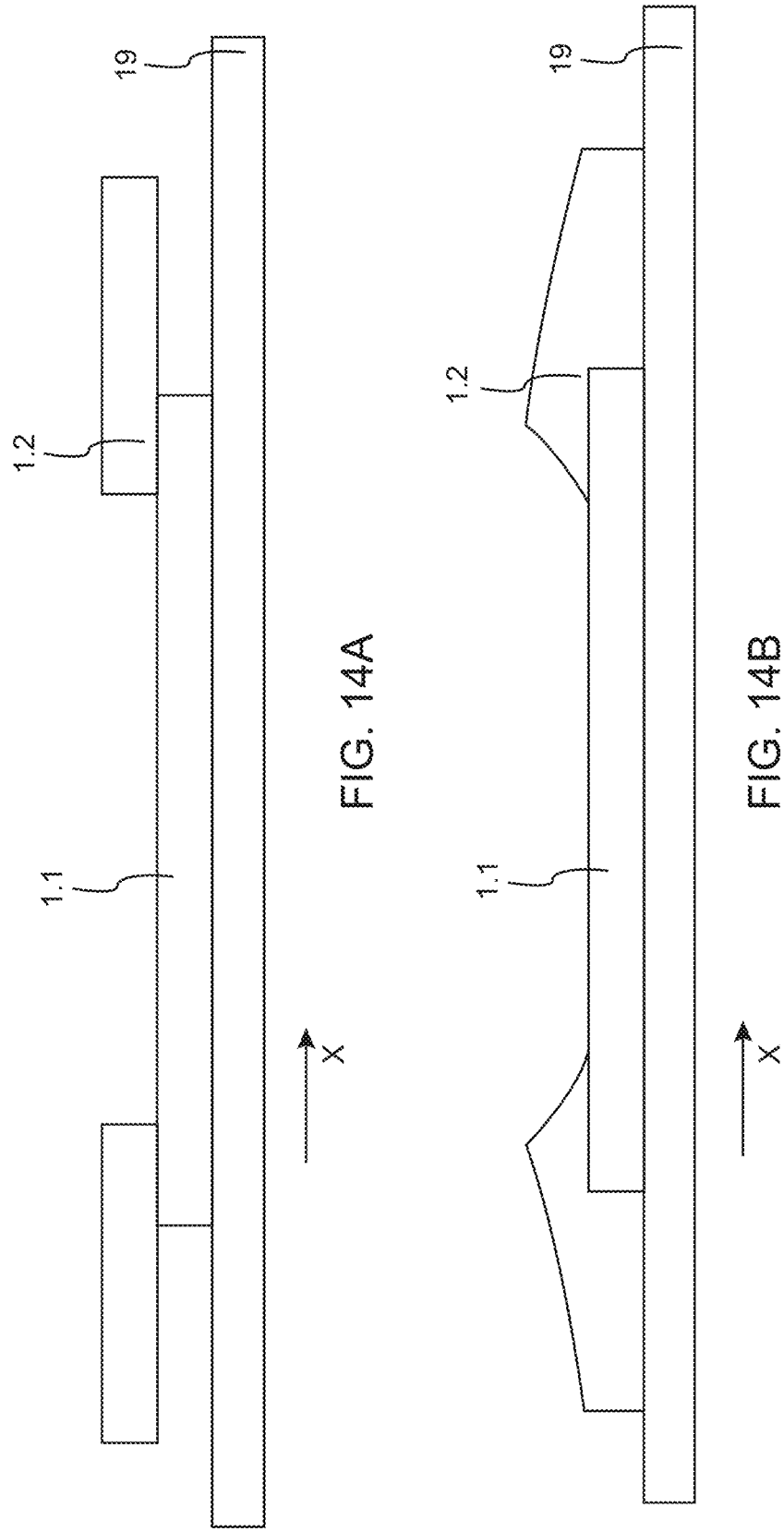

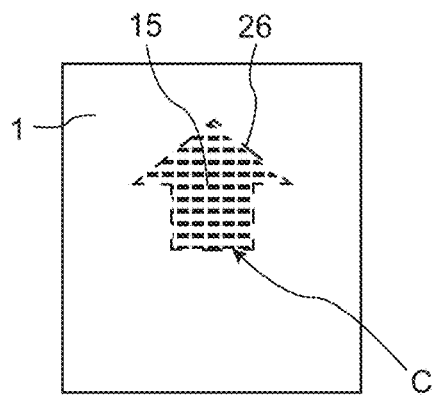
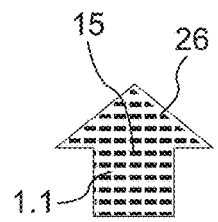
FIG. 17A  FIG. 17B
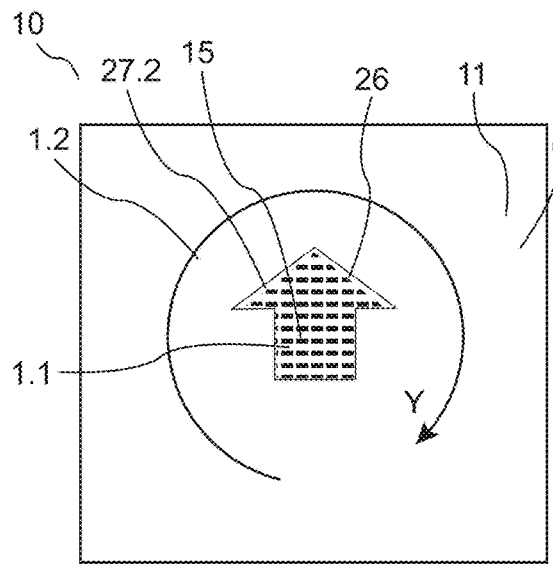
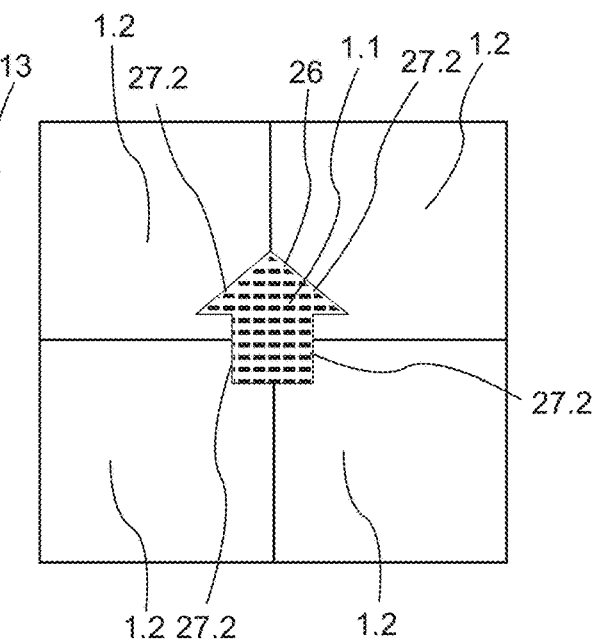
FIG. 17C  FIG. 17D
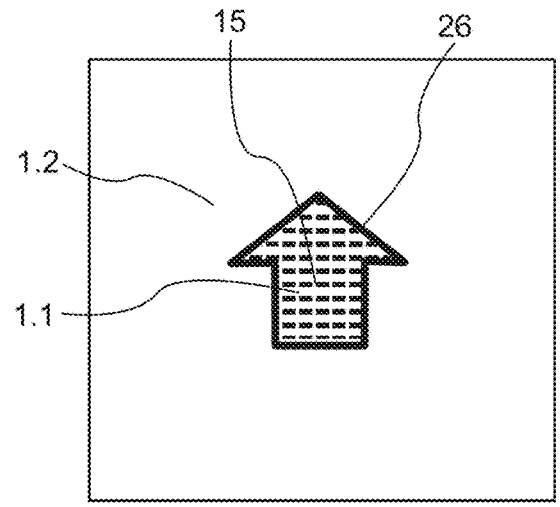
FIG. 17E

APPARATUS COMPRISING A CARRIER WITH OPTOELECTRONIC ELEMENTS AND METHOD FOR MANUFACTURING THE APPARATUS

The present application is a U.S.C. 371 National Stage entry of PCT Application No. PCT/EP2020/080475 filed Oct. 29, 2020, which claims priority from DE application No. 10 2019 133 449.7 dated Dec. 6, 2019, DK application No. PA202070104 dated Feb. 21, 2020, DE application No. 10 2020 126 792.4 dated Oct. 13, 2020, and DE application No. 10 2020 126 793.2 dated Oct. 13, 2020, the disclosures of which are incorporated herein in their entirety.

BACKGROUND OF THE INVENTION

The present invention claims priority from DE application No. 10 2019 133 449.7 dated Dec. 6, 2019, DK application No. PA202070104 dated Feb. 21, 2020, DE application No. 10 2020 126 792.4 dated Oct. 13, 2020, and DE application No. 10 2020 126 793.2 dated Oct. 13, 2020, the disclosure of which is incorporated herein in its entirety.

The invention concerns an apparatus comprising a carrier with optoelectronic elements attached to the carrier and a method for manufacturing such an apparatus.

Carriers, in particular foils, with light emitting diodes, LEDs, attached to the carriers can be mounted on or integrated into windows of vehicles, for example, in order to display information to the driver of the vehicle, such as the speed of the vehicle or speed limits. Due to manufacturing reasons, the width of such carriers is limited. In order to cover large areas several carriers need to be arranged next to each other.

Since arranging two carriers next to each other on or in a window or a cover without any gap at the interface between the carriers may be technically difficult, a person, such as a passenger in the vehicle, can see reflections occurring at the interface due to variations in the refraction index. Further, different optical transmittances at the body of the carrier and at the interface between two adjacent carriers are visible. Sharp edges of the carriers can also be visible and should be eliminated.

In addition, carriers containing LEDs are used to model diverse three-dimensional shapes. Therefore, segmenting of the carriers and arranging several segments next to each other without visible borders on a cover is a technological requirement.

Consequently there is a need to provide an optoelectronic apparatus comprising a cover and at least two carriers mounted on the cover with optoelectronic elements attached to the at least two carriers, wherein at least one of the aforementioned drawbacks is reduced or eliminated.

Additional objects of the invention are to provide a vehicle comprising the apparatus and a method for manufacturing the apparatus.

SUMMARY

An object underlying the invention is satisfied by an optoelectronic apparatus having the features of item 1. Further, objects underlying the invention are satisfied by an optoelectronic apparatus having the features of item 5, an optoelectronic apparatus having the features of item 7, a vehicle having the features of item 14, and methods for manufacturing an optoelectronic apparatus having the features of items 15, 16 and 17, respectively. Advantageous further developments and aspects of the invention are set forth in the dependent items.

In a first aspect of the instant application an optoelectronic apparatus is provided. The optoelectronic apparatus comprises a transparent first cover, at least two carriers, a plurality of optoelectronic elements and a second cover. The optoelectronic elements are configured to emit light and are attached to the at least two carriers. Further, the at least two carriers are mounted on the first cover. The second cover is mounted on the at least two carriers carrying the optoelectronic elements. Thus, the at least two carriers with the optoelectronic elements are sandwiched between the first cover and the second cover.

The second cover has at least partially a lower optical transmittance than the first cover. Alternatively or additionally, the second cover has at least partially a lower optical transmittance than the at least two carriers.

Optical transmittance, which may also be denoted as optical transmission, is a measure of what proportion of electromagnetic radiation, in particular visible light, is transmitted through a medium. Light may be attenuated, for example, due to absorption in the medium.

The at least two carriers may be arranged next to each other on the first cover. A gap between adjacent carriers may have a higher optical transmittance than the carriers with the optoelectronic elements. These different optical transmittances may be covered and thus less visible by the reduced optical transmittance of the second cover. The second cover may, for example, provide the effect of a smoked glass.

In this application, i.e., with respect to the first and all other aspects of this application, the carriers may be a foil, in particular a flexible foil. The foil may be made of, for example, polyurethane, PU, polyethylene terephthalate, PET, poly(methyl methacrylate), PMMA, polycyclic aromatic hydrocarbons, PAK, polyvinyl butyral, PVB, or any other suitable material.

One or several electrically conductive layers may be deposited on the carriers in order to provide electrical contact and redistribution for the optoelectronic elements, which are mounted on the electrically conductive layer(s).

Each of the optoelectronic elements may comprise a light emitting diode, LED, or any other suitable light emitting element. In particular, the optoelectronic elements may be micro LEDs, μLEDs, which have small lateral dimensions, for example, in the micrometer range.

The optoelectronic elements may emit light of a certain wavelength or within a certain range of wavelengths, for example, visible light or infrared, IR, light or ultraviolet, UV, light.

The optoelectronic elements may be arranged in an array on the at least two carriers and may form a display or a portion of a display. Each of the optoelectronic elements may represent a pixel of the array. Alternatively, each optoelectronic element may represent a subpixel. For example, in an RGB pixel array, a pixel may contain three optoelectronic elements emitting red, green and blue light, respectively.

The optoelectronic elements may comprise an integrated circuit, IC, and, in particular, a semiconductor chip or a packaged semiconductor chip.

Each of the first and second covers may be made of a glass material, a plastic material and/or any other suitable material. Each of the first and second covers may contain only one layer or several layers of the same or different materials.

The reduced optical transmittance of the second cover may be achieved, for example, by dots or a pattern printed on the second cover. The dots and the pattern may have a suitable shape and may be arranged in a regular or a periodic fashion or, alternatively, may be arranged in an irregular fashion or any other suitable way. Further, the second cover may include light absorbing particles, which reduce the optical transmittance of the second cover.

The optical transmittance may be reduced homogeneously over the second cover or may vary. Dithering may be used for varying the optical transmittance. For example, the density of the dots printed on the second cover may be increased in a region where a low optical transmittance is desired and the density of dots may be reduced in a region with a higher optical transmittance.

The optical transmittance may only be reduced in certain regions of the second cover.

The second cover may be colored or may have a black and white appearance.

The second cover may have the lower optical transmittance in a region at an interface between two adjacent carriers, wherein at other regions of the second cover its optical transmittance may be higher. This helps to compensate the higher optical transmittance at the interface between two adjacent carriers, where a gap between the two carriers may occur.

A gap between two adjacent carriers of the at least two carriers may be filled with a material having an optical transmittance identical or similar to the optical transmittance of the two carriers and/or a refraction index identical or similar to the refraction index of the two carriers. Such a material will be explained in more detail further below in connection with the second aspect of the application.

Alternatively, the gap between two adjacent carriers may not be filled with a material so that the gap contains air or vacuum.

In a second aspect of the instant application an optoelectronic apparatus comprises a transparent first cover and at least two carriers mounted on the first cover. Further, a plurality of optoelectronic elements, which are configured to emit light, are attached to each of the at least two carriers. A gap between two adjacent carriers of the at least two carriers is filled with a material having an optical transmittance identical or similar to the optical transmittance of the two carriers. Additionally or alternatively, the material has a refraction index similar to the refraction index of the two carriers.

The material filling the gaps makes the interface between two adjacent carriers less visible if the optical transmittance of the material is adapted to the optical transmittance of the carriers.

Further, reflections occurring at the interface between adjacent carriers are reduced if the refraction index of the material filling the gap is similar to the refraction index of the carriers.

Having a similar optical transmittance or refraction index means that the optical transmittance and the refraction index of the filler material do not differ more than 1% or 3% or 5% or 10% from the optical transmittance and the refraction index of the carriers, respectively.

The material filling the gaps can be made from, for example, silicone, epoxy resin or any other suitable material. The material may further include particles.

The optoelectronic apparatus may comprise a transparent second cover mounted on the at least two carriers such that the at least two carriers together with the optoelectronic elements attached to the carriers are sandwiched between the first and second carriers.

The second carrier may have a reduced optical transmittance as explained above in connection with the first aspect of the invention.

Further, dots or patterns may be printed on the at least two carriers and/or the material filling the gap between two adjacent carriers in order to further conceal that different materials are used.

The filler material may be deposited in the gaps between adjacent carriers by using dispensing, screen printing, spraying, in particular through a mask, or any other suitable method.

After the material has been deposited in the gaps, material protruding from the gaps may be removed in order to create a smooth surface.

In an embodiment an adhesive material is deposited on the first cover before the at least two carriers are attached to the first cover. Thereafter, the at least two carriers are pressed into the adhesive material. Portions of the adhesive materials are thereby squeezed into the gaps between adjacent carriers. In this embodiment, the adhesive material has an optical transmittance identical or similar to the optical transmittance of the two carriers and/or a refraction index identical or similar to the refraction index of the two carriers. Thus the adhesive material can be used as the filler material. The adhesive material may be, for example, made of silicone, epoxy or any other suitable material.

In a third aspect of the instant application an optoelectronic apparatus comprises a transparent first cover and at least two carriers mounted on the first cover. Further, a plurality of optoelectronic elements, which are configured to emit light, are attached to each of the at least two carriers. The optical transmittance of each of the carriers is varied in the direction of a gap between the respective carrier and an adjacent carrier.

The optical transmittance of each of the carriers may be increased in the direction of the gap between the respective carrier and the adjacent carrier. Thus, the optical transmittance may be high adjacent to the gap and may be lower further away from the gap. This helps to make the transition from the carrier to the gap less visible or softer for a viewer, in particular, if the gap contains air or vacuum. The gap may also be filled with a material as explained above in connection with the second aspect of the application.

The gradient of the optical transmittance towards the gap may be constant or steady or not constant or not steady.

The optical transmittance of each of the carriers may be varied by a perforation, i.e., holes, in the respective carrier and/or a pattern printed on the respective carrier. In case of a perforation in the carriers, an adhesive material that is used to mount the carriers to the first cover may be squeezed in the holes when the carriers are pressed on the first cover. The adhesive material may have an optical transmittance identical or similar to the optical transmittance of the two carriers and/or a refraction index identical or similar to the refraction index of the two carriers as explained above in connection with the second aspect of the application.

A transparent second cover may be mounted on the at least two carriers so that the carriers together with the optoelectronic elements are arranged between the first cover and the second cover.

The optoelectronic apparatus according to the first, second or third aspect of the application may be a window used for a vehicle, wherein the optoelectronic elements are used to create light and/or display a content or any other optical feature. In particular, the optoelectronic apparatus may be one of a roof lining, a panoramic roof, a windscreen, a rear window and a side window for a vehicle.

According to a fourth aspect of the invention, a vehicle comprises an optoelectronic apparatus of one of the first, second and third aspects.

In a fifth aspect of the instant application a method for manufacturing an optoelectronic apparatus is provided. The method comprises mounting at least two carriers on a transparent first cover, wherein a plurality of optoelectronic elements configured to emit light are attached to each of the at least two carriers, and mounting a second cover on the at least two carriers, wherein the second cover has at least partially a lower optical transmittance than the first cover and/or the at least two carriers.

The method according to the fifth aspect can be used to manufacture an optoelectronic apparatus according to the first aspect.

The method according to the fifth aspect may comprise the embodiments disclosed above in connection with the optoelectronic apparatus according to the first aspect.

In a sixth aspect of the instant application a method for manufacturing an optoelectronic apparatus is provided. The method comprises mounting at least two carriers on a transparent first cover, wherein a plurality of optoelectronic elements configured to emit light are attached to each of the at least two carriers, and filling a gap between two adjacent carriers of the at least two carriers with a material having an optical transmittance identical or similar to the optical transmittance of the two carriers and/or a refraction index identical or similar to the refraction index of the two carriers.

The method according to the sixth aspect can be used to manufacture an optoelectronic apparatus according to the second aspect.

The method according to the sixth aspect may comprise the embodiments disclosed above in connection with the optoelectronic apparatus according to the second aspect.

In a seventh aspect of the instant application a method for manufacturing an optoelectronic apparatus is provided. The method comprises mounting at least two carriers on a transparent first cover, wherein a plurality of optoelectronic elements configured to emit light are attached to each of the at least two carriers, and wherein the optical transmittance of each of the carriers is varied in the direction of a gap between the respective carrier and an adjacent carrier.

The method according to the seventh aspect can be used to manufacture an optoelectronic apparatus according to the third aspect.

The method according to the seventh aspect may comprise the embodiments disclosed above in connection with the optoelectronic apparatus according to the third aspect.

Some embodiments of the invention provide an optoelectronic apparatus, comprising a transparent first cover, a first layer segment, in particular intermediate layer segment, comprising at least one optoelectronic element arranged on the transparent first cover and a second layer segment, in particular intermediate layer segment, arranged on the transparent first cover adjacent to the first layer segment along a first direction. The first and the second layer segment comprise an approximately similar refractive index and are joined together along the first direction by a melted and resolidified material to mechanically connect the first and the second layer segment. Each of the first and the second layer segment are forming a respective boundary region, in which the first and the second layer segment are joined together, wherein the boundary regions comprises or consists of the melted and resolidified material or are at least in contact to it.

In some aspects, a third layer segment, in particular an intermediate layer segment, is arranged on the transparent first cover adjacent to the first layer segment along a second direction, wherein the second direction is different to the first direction, in particular, the first and the second direction are oriented perpendicular to each other. The first and the third layer segment comprise an approximately similar refractive index and are joined together along the second direction by a melted and resolidified material to connect the first and the third layer segment mechanically. Each of the first and the third layer segment are forming a respective boundary region, in which the first and the third layer segment are joined together, wherein the boundary regions comprises or consists of the melted and resolidified material or are at least in contact to it.

The layer segments allow forming a larger layer, for example a so-called intermediate layer, between a transparent first cover and a transparent second cover. Thus, a large surface area that corresponds to the larger layer can be formed by use of the layer segments that are joined together along the first and/or the second direction.

The layer segments can be rather thin and flexible. Thus, they can consist of a more sensitive material, such as a foil material. Using smaller layer segments and building up a larger layer from the layer segments allows simplifying the production process, since smaller size layers segments are easier to handle than a larger layer. Furthermore, it can be easier to arrange layer segments on a curved surface of, for example, a transparent cover, than a larger single layer. Using smaller layer segments and building up a larger layer on the transparent cover from the layer segments may also simplify a possible reworking in case of failure segments or makes reworking superfluous if only "good" segments are used for final assembly.

At least one optoelectronic element is arranged on the first layer segments. In some aspects, at least one optoelectronic element is arranged on each layer segment, on a number of layer segments, or on only one layer segment. Hence, there may be layer segments with no optoelectronic element arranged on it and/or layer segments with one or more optoelectronic elements arranged on it.

In some aspects, the melted and resolidified material comprises or consist of the material of the first layer segment, the material of the second layer segment, or a combination of the material of the first and second layer segment.

In some aspects, the melted and resolidified material comprises or consist of the material of the first layer segment, the material of the third layer segment, or a combination of the material of the first and third layer segment.

In some aspects, the melted and resolidified material is of a material different from the material of one of the first, second and third layer segment.

Thus, the melted and resolidified material can be formed of the material of the first layer segment, the material of the second layer segment or a combination of the material of the first and second layer segment, by melting and remodifying the boundary regions of the first and/or the second layer segments. However, the melted and resolidified material can at least partly also be formed of a material different from the material of one of the first and second layer segment, in particular it can be formed of a material with a lower melting temperature than the material of one of the first and second layer segment.

In some aspects, the melted and resolidified material comprises a refractive index similar to the first and/or second layer segment. Thus, the transparency of the optoelectronic apparatus can be improved.

The layer segments can at least be partially transparent and comprise or consist of a material, such as high or low grade polyethylene terephthalate (PET), polyethylene naphthalate (PEN), polycarbonates (PC), (colorless) polyimide (PI), Ethylene Vinyl Acetate (EVA), Polyvinyl Butyral (PVB) or ionomer based layers. Particularly, the layer segments can comprise or consist of an at least partially transparent plastic, in particular an at least partially transparent foil. A height of the layer segments can for example be smaller than 1 mm, particularly smaller than 500 μm and even more particularly smaller than 200 μm.

The transparent first cover can at least be partially transparent and comprise or consist of a material, such as Ethylene Vinyl Acetate (EVA), Polyvinyl Butyral (PVB) or a ionomer based system. Particularly the transparent first cover can comprise or consist of an at least partially transparent plastic, in particular an at least partially transparent foil.

In some aspects, the at least one optoelectronic element can be a light emitting diode, LED that is a volume emitter or surface emitter. The at least one optoelectronic element can be controlled individually. Thus, a light distribution can be controlled in the optoelectronic apparatus. The individual control of the at least one optoelectronic element can for example be achieved by individually controlling the electric current that is provided to each optoelectronic element. An LED can form a pixel or a subpixel and emit light of a selected colour, such as for example an RGB-Pixel.

In some aspects, the at least one optoelectronic element, in particular LED, can be smaller than 300 μm, in particular smaller than 150 μm. With these spatial extensions, at least one optoelectronic element is almost invisible for the human eye.

In some embodiments, the at least one optoelectronic element is a LED. A LED can in particular be referred to as a mini LED, which is a small LED, for example, with edge lengths of less than 200 μm, in particular down to less than 40 μm, in particular in the range from 200 μm to 10 μm. Another range is between 150-40 μm. However, the LED can also be referred to as a micro LED, also called μLED, or a μLED-chip, in particular for the case of the edge lengths being in a range of 100 μm to 10 μm.

A mini LED or a μLED-chip, can be used as optoelectronic element. The mini LED or μLED-chip can form a pixel or a subpixel and emit light of a selected colour. A mini LED or a μLED-chip can form a pixel or a subpixel and emit light of a selected colour, such as for example a RGB-Pixel. The mini LED or μLED-chip can in a preferred embodiment be an unpackaged semiconductor chip. Unpackaged can mean that the chip is without a housing around its semiconductor layers such as for example an unpacked semiconductor die.

In some aspects, the at least one optoelectronic element can be a sensor, in particular a photosensitive sensor such as a photodiode.

In some aspects, the optoelectronic apparatus can comprise a connector area and a programming area being arranged adjacent to the first layer segment and being electrically coupled to the at least one optoelectronic element to control the optoelectronic element and supply energy to it.

Further embodiments provide an optoelectronic system comprising an optoelectronic apparatus according to any one of the preceding aspects arranged between two transparent plates, in particular glass plates, wherein the transparent first cover can form one of the transparent plates.

In some aspects, the optoelectronic system forms an at least partially transparent pane of a vehicle, particularly a windshield or a window of a vehicle. Accordingly, the pane and particularly the windshield or window comprises at least one optoelectronic element to enlighten the pane at least partially and/or to display information on at least parts of the pane.

The optoelectronic system can be part of any other surface, as for example the headliner or the outer surface of for example a vehicle. Accordingly, the optoelectronic system can have a 3-dimensional shape and/or it can be arranged on a surface that is curved. The headliner or the outer surface thus comprises at least one optoelectronic element to enlighten the headliner or the outer surface at least partially and/or to display information on at least parts of the headliner or the outer surface.

The manufacturing of small layer segments, in particular compared to complete layers of the size of for example the size of a windshield of a vehicle can be easier and more cost effective. Thus, by arranging two or more layer segments adjacent to each other on for example a transparent cover it is possible to provide a simpler and cost-effective method to manufacture an optoelectronic system with particularly large dimensions. Further, it can be easier to arrange layer segments adjacent to each other on a transparent cover, which has for example a 3-dimensional shape, as if the layer segments would be of the same size as the transparent cover.

Some embodiments provide a method for manufacturing an optoelectronic apparatus comprising the steps:
  providing a temporary carrier layer,
  arranging a first layer segment on the temporary carrier layer comprising at least one optoelectronic element
  arranging a second layer segment adjacent to the first layer segment along a first direction on the temporary carrier layer, wherein the first and second layer segment comprise an approximately similar refractive index
  joining the first and second layer segment together, such that a melted and resolidified material is arranged between adjacent edges of the first and second layer segment along the first direction.

In some aspects, the step of arranging the second layer segment adjacent to the first layer segment along a first direction comprises overlapping the first and second layer segment in an edge region of the first and second layer segment.

In some aspects, the step of joining the first and second layer segment together comprises heating at least boundary regions of the first and/or second layer segment such that the overlapping layer segment flows into a gap between the first and second layer segment forming the melted and resolidified material. The gap can particularly be formed by the opening, which is caused by overlapping the first and second layer segment below the overlapping layer segment.

In some aspects, the step of joining the first and second layer segment together comprises heating at least boundary regions of the first and/or second layer segment such that the melted and resolidified material is formed of the material of the first and/or second layer segment. The first and second layer segment can therefore be arranged adjacent to each other along the first direction with a predefined distance, in particular a distance smaller than 1 mm. Thus, when heating at least boundary regions of the first and/or second layer segment the material of at least the boundary regions of the first and/or second layer segment flows into the gap between the first and second layer segment.

In some aspects, the boundary regions of the first and/or second layer segment can be heated by use of for example an oven, locally applied laser light, an infrared heater, or at least locally heating the temporary carrier layer. In some aspects, the boundary regions of the first and/or second layer segment can be heated in vacuum atmosphere to avoid air pockets and thus increase the transparency of the optoelectronic apparatus.

In some aspects, the temporary carrier layer can comprise or consist of a material with a good thermal conductivity such as for example a metall.

In some aspects, the step of joining the first and second layer segment together comprises partially chemically dissolving the first and/or second layer segment such that the melted and resolidified material is formed of the material of the first and/or second layer segment. The first and second layer segment can therefore be arranged adjacent to each other along the first direction with a predefined distance, in particular a distance smaller than 1 mm. Thus, when partially chemically dissolving at least boundary regions of the first and/or second layer segment the material of at least the boundary regions of the first and/or second layer segment flows into the gap between the first and second layer segment.

In some aspects, the method further comprises the steps:
arranging a third layer segment adjacent to the first layer segment along the first direction on the temporary carrier layer opposite to the second layer segment,
arranging a fourth layer segment on top of the first, second and third layer segment,
wherein the first, the second, the third and the fourth layer segment comprise an approximately similar refractive index and optionally comprise or consist of a similar material.

In some aspects, the method further comprises the step of joining the second, third and fourth layer segment together, such that a melted and resolidified material is arranged between adjacent edges of the second, third and fourth layer segment, such that the first layer segment is covered with the second, third and fourth layer segment.

Further embodiments provide a method for manufacturing an optoelectronic apparatus comprising the steps:
providing a temporary carrier layer,
arranging a first layer segment comprising at least one optoelectronic element on the temporary carrier layer
arranging a second layer segment on the first layer segment such that the second layer segment is overlapping at least one edge region of the first layer segment, wherein the first and second layer segment comprise an approximately similar refractive index
joining the first and second layer segment together such that the second layer segment nestles up to the contour of the first layer segment.

In some aspects, the step of joining the first and second layer segment together can be performed by melting and resolidifying a material between adjacent edges of the first and second layer segment or by deep drawing the second layer segment.

In some aspects, the second layer segment is completely overlapping the first layer segment.

In some aspects, the second layer segment extends at least partially over the edges of the first layer.

In some aspects, the method further comprises the step of removing the joined layer segments from the temporary carrier layer and arranging them on a transparent first cover.

The object of the invention is satisfied by an optoelectronic apparatus comprising an at least partially transparent first cover, a second cover and at least one first layer segment. The at least one first layer segment is in particular an intermediate layer segment, which is arranged between the first cover and the second cover and carries an arrangement of a plurality of optoelectronic light sources. The optoelectronic light sources can be embedded in the first layer segment or can be arranged on an upper surface area of the first layer segment. The arrangement of the plurality of optoelectronic light sources has, in particular when seen in a top view of the optoelectronic apparatus, a defined shape with a defined contour. The top view of the optoelectronic apparatus can for example correlate with a top view of for example the first cover. In addition, the first layer segment has the same shape and the same contour as the arrangement of the plurality of optoelectronic light sources.

If the first layer segment carries an arrangement of a plurality of optoelectronic light sources and the first layer segment has not the same shape and not the same contour as the arrangement of the plurality of optoelectronic light sources, the contour of the first layer segment—not matching with the contour of the arrangement of optoelectronic light sources—can be visible due to a refractive index difference between the first layer segment and a surrounding medium, in particular when the light sources are switched on. In other words, when the optoelectronic light sources are switched on, not only the optoelectronic light sources can light up, but also the contour of the first layer segment can be illuminated due to a propagation of light within the first layer segment and an outcoupling of the light at the contour of the first layer segment. The illumination of the contour of the intermediate layer can be an undesired light extraction, as it can be perceived as annoying by a user of the optoelectronic apparatus.

If the first layer segment however carries an arrangement of a plurality of optoelectronic light sources and the first layer segment has the same shape and the same contour as the arrangement of the plurality of optoelectronic light sources, a disruptive light extraction at the contour of the first layer segment and thus a visibility of the contour of the first layer segment is pushed onto the contour of the arrangement of the plurality of optoelectronic light sources. Thus, an illumination of the contour of the first layer segment due to a refractive index difference between the first layer segment and a surrounding medium can no longer be disruptive to a user of the optoelectronic apparatus.

The term "contour" can mean an outer contour and/or an inner contour. The contour of the arrangement of the plurality of optoelectronic light sources and thus the contour of the first layer segment can for example be of a ring like shape, wherein the inner ring can be the inner contour and the outer ring can be the outer contour.

The contour of the arrangement of the plurality of optoelectronic light sources and thus the contour of the first layer segment can however be of any other shape, as for example a circle, a rectangle, an arrow, any symbol or an indicator and may not have an inner contour. In addition, the contour doesn't need to be continuous and can consist instead of multiple smaller segments.

In some embodiments, the optoelectronic apparatus further comprises at least one second layer segment. The second layer segment is in particular an intermediate layer segment which is arranged in the same layer as the at least one first layer segment between the first cover and the second cover. The second layer segment comprises a second edge, which is complementary shaped to at least a first portion of the contour of the first layer segment. In addition, the second layer segment is arranged adjacent to the first layer segment such that the second edge is adjacent to the first portion of the contour.

The term "second edge" can relate to an outer or an inner edge of the second layer segment. The second edge of the second layer segment can for example be at least a portion of the inner ring of a ring like shape or it can be at least a portion the outer contour of any shape of the second layer segment. The second edge of the second layer segment can be of any shape. For example, it can be a circle, a rectangle, an arrow, any symbol, an indicator, or a negative of at least a part of any one of the pre-mentioned shapes.

The first portion of the contour of the first layer segment can for example comprise a curved line and/or a line comprising a kink. Hence, the second edge—which is complementary shaped to the first portion of the contour of the first layer segment—can comprise a curved line and/or a line comprising a kink, which is complementary shaped to the curved line and/or the line comprising a kink of the contour of the first layer segment.

In some embodiments, the second edge is complementary shaped to at least the first portion of the contour of the first layer segment and the second layer segment is arranged adjacent to the first layer segment such that the second edge is adjacent to the first portion of the contour. In other words, the second edge and the first portion of the contour of first layer segment can fit to each other as for example two puzzle pieces, which are put together. However, in contrast to a puzzle, there are usually no parts that interlock.

In some embodiments, the second layer segment is formed by one of the following:
a molten material layer or
an adhesive layer, in particular a hot-melt adhesive layer, or
a resin, such as PVB or EVA.

In some embodiments, the second layer segment can enclose the first layer segment in the same layer. The second layer segment can have the same height as the first layer segment, however the second layer segment can also have a height which is different, in particular larger, than the height of the first layer segment. The second layer segment can thus enclose the first layer segment not only in a circumferential direction, but the first layer segment can be completely embedded in the second layer segment.

In some embodiments, the second edge is in contact, particularly in direct contact, with the first portion of the contour, in particular along the full length of the first portion of the contour. A refractive index difference can thus occur between the material of the first and the second layer segment. However a small gap, particularly an air gap, can be arranged between the second edge and the first portion of the contour and thus between the first and the second layer segment. The refractive index difference can thus occur between the first layer segment and the air within the gap.

In some embodiments, the contour and the second edge are both closed in a circumferential direction and the second edge is complementary shaped to the contour along its complete circumferential length. The first layer segment can for example have the shape of a circle, a rectangle or any desired symbol, and the second layer segment can for example comprise a layer segment with the shape of the first layer segment being cut out.

The contour of the cutout of the second layer segment can therefore form the second edge.

In some embodiments, the optoelectronic light sources are equally distributed on the at least one first layer segment. Each of the optoelectronic light sources can form a pixel, wherein the optoelectronic light sources can be distributed over a surface area of the at least one first layer segment such as to obtain a desired resolution. The resolution can thereby be defined by the number of pixels divided by the surface area on which the pixels are arranged.

In some embodiments, a LED is used as optoelectronic light source. A LED can in particular be referred to as a mini LED, which is a small LED, for example with edge lengths of less than 200 µm, in particular down to less than 40 µm, in particular in the range from 200 µm to 10 µm. Another range is between 150-40 µm. However, the LED can also be referred to as a micro LED, also called µLED, or a µLED-chip, in particular for the case of the edge lengths being in a range of 100 µm to 10 µm.

A mini LED or a µLED-chip, can be used as optoelectronic light source. The mini LED or µLED-chip can form a pixel or a subpixel and emit light of a selected colour. The mini LED or µLED-chip can in a preferred embodiment be an unpackaged semiconductor chip. Unpackaged can mean that the chip is without a housing around its semiconductor layers such as for example an unpacked semiconductor die.

In some embodiments, each optoelectronic light source can comprise a mini LED or a µLED-chip configured to emit light of a selected color. In some embodiments, each optoelectronic light source can comprises one or more mini LEDs, or µLED-chips, such as for example a RGB-Pixel, which comprises three mini LEDs or µLED-chips. A RGB-Pixel can for example emit light of the colors red, green and blue as well as any mixed color.

In some embodiments, an RGB-Pixel can further comprise one or more integrated circuits (IC), in particular small integrated circuits as for example micro integrated circuits (µIC).

In some embodiments, the size of the first layer segment is significantly smaller than the size of the first cover, in particular when seen in a top view of the optoelectronic apparatus. Thus, the arrangement of the plurality of optoelectronic light sources, which forms for example a symbol or an indicator, can illuminate only a small area of the first cover and thus of the optoelectronic apparatus. In some embodiments, the first layer segment can form a small display between the first and the second cover, wherein the size of the display is significantly smaller than the size of the first cover. Significantly smaller can for example mean that the size of the first layer segment is within a range of 0.5-20% of the size of the first cover.

In some embodiments, the first layer segment is arranged between the first cover and the second cover such that, in particular when seen in a top view of the optoelectronic apparatus, the first layer segment is not arranged within a boundary region of the first cover. The boundary region of the first cover particularly extends from outer edges of the first cover at least approximately 5 mm to the inside of the first cover.

In some embodiments, the first layer segment comprises a surface side which extends along the contour of the first layer segment in a vertical direction. The material of the first layer segment can comprise at least one of the following on the surface side: scattering particles, defects, and voids. The scattering particles, defects or voids can for example be formed by a laser cutting process which is used to obtain the contour of the first layer segment. The vertical direction can particularly be the direction, which is perpendicular to the layers of the optoelectronic apparatus.

The scattering particles, defects, and/or voids can increase a refractive index difference between the first layer segment and any other layer segment being arranged adjacent to the first layer segment.

In some embodiments, the optoelectronic apparatus further comprises at least one third layer segment. The third layer segment is in particular an intermediate layer segment arranged in the same layer as the at least one first layer segment between the first cover and the second cover. The third layer segment comprises at least one conductor line and preferably two conductor lines, particularly to supply electric energy and/or a data signal to the plurality of optoelectronic light sources. The third layer segment further comprises a third edge, which is complementary shaped to at least a second portion of the contour of the first layer segment. In addition, the third layer segment is arranged adjacent to the first layer segment such that the third edge is adjacent to the second portion of the contour.

The term "third edge" relates to an outer or an inner edge of the third layer segment. The third edge of the third layer segment can for example be at least a portion of an inner ring of a ring like shape, or it can be at least a portion of an outer contour of any shape of the third layer segment. However, it can be preferred that the third edge is complementary shaped to a portion of the outer contour of any shape of the first layer segment.

In some embodiments, the third edge is in contact, particularly in direct contact, with the second portion of the contour, in particular along the full length of the second portion of the contour. A refractive index difference can thus occur between the material of the first and the third layer segment. However, a small gap, particularly an air gap, can be arranged between the third edge and the second portion of the contour and thus between the first and the third layer segment. The refractive index difference can thus occur between the first layer segment and the air within the gap.

In some embodiments, the third layer segment comprises a surface side, which extends along the third edge in a vertical direction. The material of the third layer segment can comprise at least one of the following on the surface side: scattering particles, defects, and voids. The vertical direction can particularly be the direction, which is perpendicular to the layers of the optoelectronic apparatus.

In some embodiments, the first layer segment and/or a second layer segment and/or a third layer segment are made of one piece. A plurality of perforations can extend along the contour of the first layer segment to differentiate the layer segments from each other while the layer segments remain one piece. In particular, the first layer segment and/or a second layer segment and/or a third layer segment are made of the same material being connected to each other. The single layer segments can be distinguished by a plurality of perforations extending along the contour of the first layer segment. Due to the perforations, the contour of the first layer segment can get ragged and thus the refractive index difference between the first layer segment and/or the second layer segment and/or the third layer segment can be increased.

In some embodiments, the first layer segment and the third layer segment are made of one piece. A plurality of perforations can extend along a second portion of the contour of the first layer segment which is complementary shaped to a third edge of the third layer segment. The first layer segment can comprise the arrangement of the plurality of optoelectronic light sources whereas the third layer segment can comprise at least one conductor line and preferably two conductor lines, particularly to supply electric energy and/or a data signal to the plurality of optoelectronic light sources.

In some embodiments, the first layer segment, the second layer segment and the third layer segment are made of one piece. A plurality of perforations can extend along the whole contour of the first layer segment which is complementary shaped to a second edge of the second layer segment and a third edge of the third layer segment. The first layer segment can comprise the arrangement of the plurality of optoelectronic light sources, the third layer segment can comprise at least one conductor line and preferably two conductor lines, particularly to supply electric energy and/or a data signal to the plurality of optoelectronic light sources and the second layer segment can enclose the first and the third layer segment in a circumferential direction.

In some embodiments, the first and the second layer segment and/or the first and the third layer segment have different refractive indices. In some embodiments, the first layer segment has a different refractive index to any layer segment and/or the first and second cover. Thus, light from the plurality of optoelectronic light sources that propagates through the first layer segment is scattered in a boundary region between the first layer segment and any layer segment and/or between the first layer segment and the first and/or second cover.

In some embodiments, at least one and preferably all of the layer segments consist or comprise of an at least partially transparent or blackened material. By use of a blackened material, the impact of light being scattered in a boundary region between the first layer segment and any layer segment and/or between the first layer segment and the first and/or second cover can be reduced.

In a further embodiment of the invention, a method of manufacturing an optoelectronic apparatus is provided. The method comprises a step of providing at least one first layer segment first layer segment, in particular intermediate layer segment, which carries an arrangement of a plurality of optoelectronic light sources. The arrangement of the plurality of optoelectronic light sources has a defined shape with a defined contour and the first layer segment has the same shape and the same contour as the arrangement of the plurality of optoelectronic light sources. The method further comprises a step of providing an at least transparent first cover and a second cover, and a step of arranging the first layer segment between the first cover and the second cover.

In some embodiments, the step of providing at least one first layer segment comprises a step of providing, in particular cutting or laser cutting, the first layer segment out of a larger first layer. The first layer segment thereby has, at least when seen in a top view of the optoelectronic apparatus, the same shape and the same contour as the arrangement of the plurality of optoelectronic light sources.

In some embodiments, the method further comprises a step of arranging a second layer segment between the first cover and the second cover, wherein a second edge of the second layer segment is adjacent to the first portion of the contour. The second edge is in particular complementary shaped to at least a first portion of the contour of the first layer segment.

In some embodiments, the second layer segment is arranged between the first cover and the second cover before the first layer segment. The second layer segment can for example be a hot-melt adhesive layer, such as for example a polyvinyl butyral (PVB) or ethylene-vinyl acetate (EVA) layer, being arranged on at least one of the first cover and the second cover and the first layer segment can be positioned on the second layer segment or pressed into the second layer segment in a melted or at least softened state of the second layer segment. The second edge can thus be complementary shaped to at least a first portion of the contour of the first layer segment as the melted or at least softened material of the second layer segment follows the contour of the first layer segment.

Alternatively, the first layer segment is arranged between the first cover and the second cover before the second layer segment. The second layer segment can thus be arranged adjacent to the first layer segment such as to put two puzzle pieces together.

In some embodiments, the step of providing the first layer segment comprises a step of exposing a surface side of the first layer segment to laser light. The surface side extends along the contour of the first layer segment in a vertical direction. The step of exposing the surface side to laser light can optionally be a laser-cutting step. Due to exposing the surface side of the first layer segment to laser light small defects or voids are generated on the surface side of the first layer segment. Particularly, when cutting the first layer segment out of the first layer by use of a laser-cutting step, small defects in form of burning marks and clumped material and voids are generated in the material of the first layer segment on its surface.

In some embodiments, the method further comprises a step of providing scattering particles on a surface side of the first layer segment. The surface side particularly extends along the contour of the first layer segment in a vertical direction.

In some embodiments, the method further comprises a step of providing a third layer segment in the same layer as the at least one first layer segment between the first cover and the second cover. The third layer segment comprises at least one conductor line and preferably two conductor lines, as well as a third edge. The third edge is complementary shaped to at least a second portion of the contour of the first layer segment.

In some embodiment, the method further comprises a step of arranging the third layer segment between the first cover and the second cover adjacent to the first layer segment such that the third edge is adjacent to the second portion of the contour.

In some embodiments, the second layer segment is arranged between the first cover and the second cover before the first layer segment and the third layer segment. The second layer segment can for example be a hot-melt adhesive layer, such as for example a PVB or EVA layer, being arranged on at least one of the first cover and the second cover and the first layer segment as well as the third layer segment can be positioned on the second layer segment or pressed into the second layer segment in a melted or at least softened state of the second layer segment.

Alternatively, the first layer segment as well as the third layer segment are arranged between the first cover and the second cover before the second layer segment. The second layer segment can thus be arranged adjacent to the first layer segment and the third layer segment such as to put puzzle pieces together.

In some embodiments, the method further includes a step of providing scattering elements, defects and/or voids in a surface side of the third layer segment. The surface side of the third layer segment is extending along the third edge of the third layer segment in a vertical direction. The vertical direction can particularly be the direction, which is perpendicular to the layers of the optoelectronic apparatus. The step of providing scattering elements, defects and/or voids in the surface side of the third layer segment can for example comprise a step of exposing the surface side to laser light, a laser-cutting step, or a step of applying scattering particles to the surface side. A step of applying scattering particles to the surface side can for example comprise a screen printing or a stencil printing process as well as spraying the scattering particles to the surface side.

In some embodiments, the method further includes a step of producing a sequence of perforations in the third layer segment. The sequence of perforations extends preferably adjacent to the third edge and the perforations can intersect the third edge. Between each two of the perforations, the at least one conductor line can be guided through to still allow electric energy and/or a data signal to be transferred to the plurality of optoelectronic light sources. By producing the sequence of perforations the third edge can get ragged and thus the refractive index difference between the first and the third layer can be increased.

In some embodiments, the optoelectronic apparatus or device comprises a first layer, also referred to as first layer segment or carrier or carrier layer, as well as a first cover and a second cover. The first cover and the second cover can also be a layer, and, thus, they may be called first cover layer and second cover layer. The first layer can be arranged between the first cover and the second cover. The first layer can carry the at least one optoelectronic element or optoelectronic light source and/or the at least one optoelectronic element or optoelectronic light can be partially or completely embedded in the first layer.

In some embodiments, the first layer can at least be partially transparent and comprise or consist of a material, such as high or low grade polyethylene terephthalate (PET), polyethylene naphthalate (PEN), polycarbonates (PC), (colorless) polyimide (PI), polyurethane (PU), poly(methyl methacrylate) (PMMA), polycyclic aromatic hydrocarbons (PAK), or any other suitable material. Particularly, the layer segments can comprise or consist of an at least partially transparent plastic, in particular an at least partially transparent foil, in particular a flexible foil.

Each of the first and second cover may be made of a glass material, a plastic material and/or any other suitable material. Each of the first and second covers may contain only one layer or several layers of the same or different materials.

In some embodiments, the optoelectronic apparatus further comprises at least one auxiliary layer, which also is referred to as second, third or fourth layer segment. A first auxiliary layer can be arranged between the first layer and the first cover and optionally a second auxiliary layer can be arranged between the first layer and the second cover.

The at least one auxiliary layer can be formed by one of the following:
 a molten material layer or
 an adhesive layer, in particular a hot-melt adhesive layer,
 a resin, such as Ethylene Vinyl Acetate (EVA), Polyvinyl Butyral (PVB), or
 a ionomer based system.

In some embodiments, the at least one auxiliary layer can enclose the first layer in the same layer. The at least one auxiliary layer can have the same height as the first layer, however the at least one auxiliary layer can also have a height which is different, in particular larger, than the height of the first layer. The at least one auxiliary layer can enclose the first layer not only in a circumferential direction, since the first layer can be completely embedded in the at least one auxiliary layer.

In some embodiments, the at least one auxiliary layer can at least be partially transparent. In some embodiments, the at least one auxiliary layer can be blackened, resulting in an at least partially transparent auxiliary layer. If the optoelectronic apparatus comprises more than one auxiliary layer, none, one, a selection of the auxiliary layers, or all auxiliary layers can be blackened.

In some embodiments, the at least one optoelectronic element or optoelectronic light source, in particular LED, can be smaller than 300 µm, in particular smaller than 150 µm. With these spatial extensions, at least one optoelectronic element or optoelectronic light source is almost invisible for the human eye.

In some embodiments, the at least one optoelectronic element or optoelectronic light source is a LED. A LED can in particular be referred to as a mini LED, which is a small LED, for example, with edge lengths of less than 200 µm, in particular down to less than 40 µm, in particular in the range from 200 µm to 10 µm. Another range is between 150 µm to 40 µm.

The LED also can be referred to as a micro LED, also called µLED, or a µLED-chip, in particular for the case of the edge lengths being in a range of 100 µm to 10 µm. In some embodiments, the LED can have spatial dimensions of 90×150 µm or the LED can have spatial dimensions of 75×125 µm.

The mini LED or µLED-chip can in some embodiments be an unpackaged semiconductor chip. Unpackaged can mean that the chip is without a housing around its semiconductor layers such as for example an unpacked semiconductor die. In some embodiments, unpackaged can mean that the chip is free of any organic material. Thus, the unpackaged device does not contain organic compounds, which contain carbon in covalent bonding.

In some embodiments, each optoelectronic element or optoelectronic light source can comprise a mini LED or a µLED-chip configured to emit light of a selected color. In some embodiments, each optoelectronic element or optoelectronic light source can comprises one or more mini LEDs, or µLED-chips, such as for example a RGB-Pixel, which comprises three mini LEDs or µLED-chips. A RGB-Pixel can for example emit light of the colors red, green and blue as well as any mixed color.

In some embodiments, an RGB-Pixel can further comprise one or more integrated circuits (IC), in particular small integrated circuits as for example micro integrated circuits (µIC).

In some embodiments, the optoelectronic apparatus comprises at least one conductor line and preferably two conductor lines, particularly to supply electric energy and/or a data signal to the at least one optoelectronic element or optoelectronic light source.

In some embodiments, the first layer carries the at least one conductor line. However in some embodiments, at least one auxiliary layer can carry the at least one conductor line.

In some embodiments, the at least one conductor line can be of a conductive material, such as for example copper. The at least one conductor line can be coated and/or blackened to reduce the reflectance of the outer surface area of the at least one conductor line. The coating can for example be a palladium or molybdenum coating. In some embodiments, the at least one conductor line can have a width in the range between 5 µm to 50 µm.

In some embodiments, the at least one conductor line can be formed as a conductive mesh, particularly a metallic mesh. The mesh can be coated and/or blackened, in particular to reduce the reflectance of the outer surface area of the conductive mesh. The coating can for example be a palladium or molybdenum coating.

In some embodiments, an optoelectronic apparatus or device comprises a layer stack, which includes a first layer as well as a first cover and a second cover. The first layer is in particular an intermediate layer, which is arranged between the first cover layer and the second cover layer. At least one electronic or optoelectronic element, in particular an optoelectronic light source, is arranged on the first layer and at least one layer of the layer stack and preferably all layers of the layer stack are at least partially transparent. The layer stack comprises at least one electrically conductive layer, which is arranged between two adjacent layers of the layer stack or embedded in a layer.

In some embodiments, the at least one electrically conductive layer comprises at least one conductive line which is electrically connected to a contact pad of the optoelectronic light source. The at least one electrically conductive layer can be of a good electrically and thermally conductive material such as for example copper, silver, gold and aluminum. The at least one electrically conductive layer and particularly the at least one conductive line can be coated and/or blackened to reduce the reflectance of the outer surface area of the at least one conductive line. The coating can for example be a palladium or molybdenum coating. In some embodiments, the at least one electric line can have a width in the range between 5 µm to 50 µm.

The at least one electrically conductive layer can comprise an electrically conductive mesh, for example a metallic mesh, in particular a copper mesh. The mesh can have nodes and interconnects between the knots, wherein, preferably, at least the majority of the interconnects are not interrupted. The at least one electrically conductive layer can thus be structured and comprise a plurality of conductive lines being connected with each other.

The mesh can have a regular or an irregular pattern, wherein an irregular pattern can be preferred, as an irregular pattern can increase the transparency of the electrically conductive layer.

The reason for this can be that an irregular pattern can be more difficult to perceive by the human eye.

In some embodiments, the conductive mesh is coated and/or blackened, in particular to reduce the reflectance of the outer surface area of the conductive mesh. The coating can for example be a palladium or molybdenum coating.

At least some embodiments of the optoelectronic apparatus or device as described herein can be arranged on non-flat or curved surfaces, for example on the outside or in the interior of a vehicle or a building. This is in particular possible as at least some embodiments of the optoelectronic apparatus or device as described herein can be built on the basis of a layer structure which is flexible.

The invention therefore also relates to a larger entity, such as a vehicle or building, which comprises on its exterior or interior, in particular on an exterior or interior surface, at least one optoelectronic apparatus or device.

The description with the aid of the exemplary embodiments does not limit the invention thereto. Rather, the invention comprises any new feature and any combination of features, which in particular includes any combination of features in the patent claims, even if this feature or this combination is not itself explicitly stated in the patent claims or exemplary embodiments.

BRIEF DESCRIPTION OF THE DRAWINGS

The following description of figures may further illustrate and explain exemplary embodiments. Components that are functionally identical or have an identical effect are denoted by identical references. Identical or effectively identical components might be described only with respect to the figures where they occur first. Their description is not necessarily repeated in successive figures. There are shown in the drawings:

FIGS. 9A and 9B cross sectional views of steps of a method to manufacture an optoelectronic apparatus in accordance with the present invention;

FIGS. 10A and 10B cross sectional views of steps of a method to manufacture another optoelectronic apparatus in accordance with the present invention;

FIG. 12A to 12C cross sectional views of steps of a method to manufacture another optoelectronic apparatus in accordance with the present invention;

FIGS. 14A and 14B cross sectional views of steps of another method to manufacture an optoelectronic apparatus in accordance with the present invention;

FIG. 16C a schematic representation of an intermediate layer equipped with an arrangement of optoelectronic light sources arranged between a first and a second cover when the optoelectronic light sources are switched on;

FIG. 17A a schematic representation of an intermediate layer equipped with an arrangement of optoelectronic light sources with a cutting line around the arrangement;

FIG. 17B a schematic representation of an intermediate layer equipped with an arrangement of optoelectronic light sources being cut out along the contour of the arrangement;

FIGS. 17C and 17D schematic representations of an optoelectronic apparatus in accordance with the present invention;

FIG. 17E a schematic representation of an optoelectronic apparatus in accordance with the present invention when the optoelectronic apparatus is in operation;

DETAILED DESCRIPTION

Figure 1A:
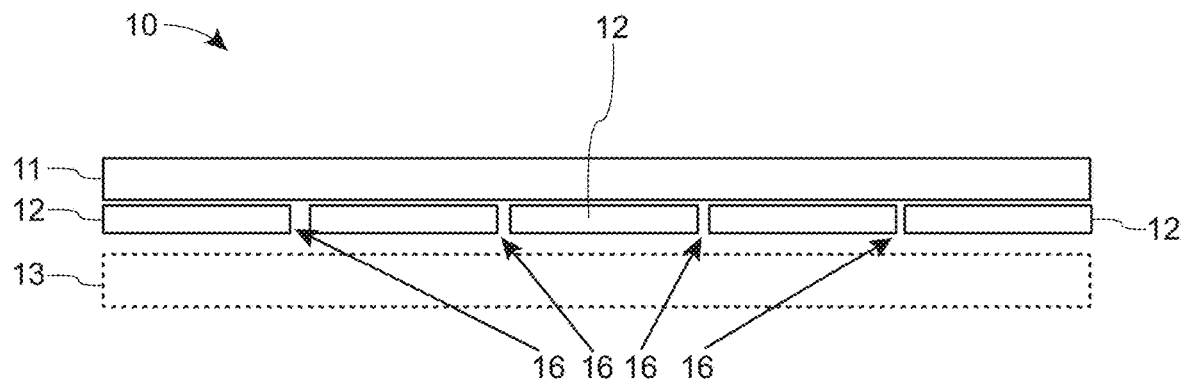
FIGS. 1A and 1B schematic representations of an optoelectronic apparatus comprising a first cover, several carriers with LEDs and a second cover.
Figure 1B:
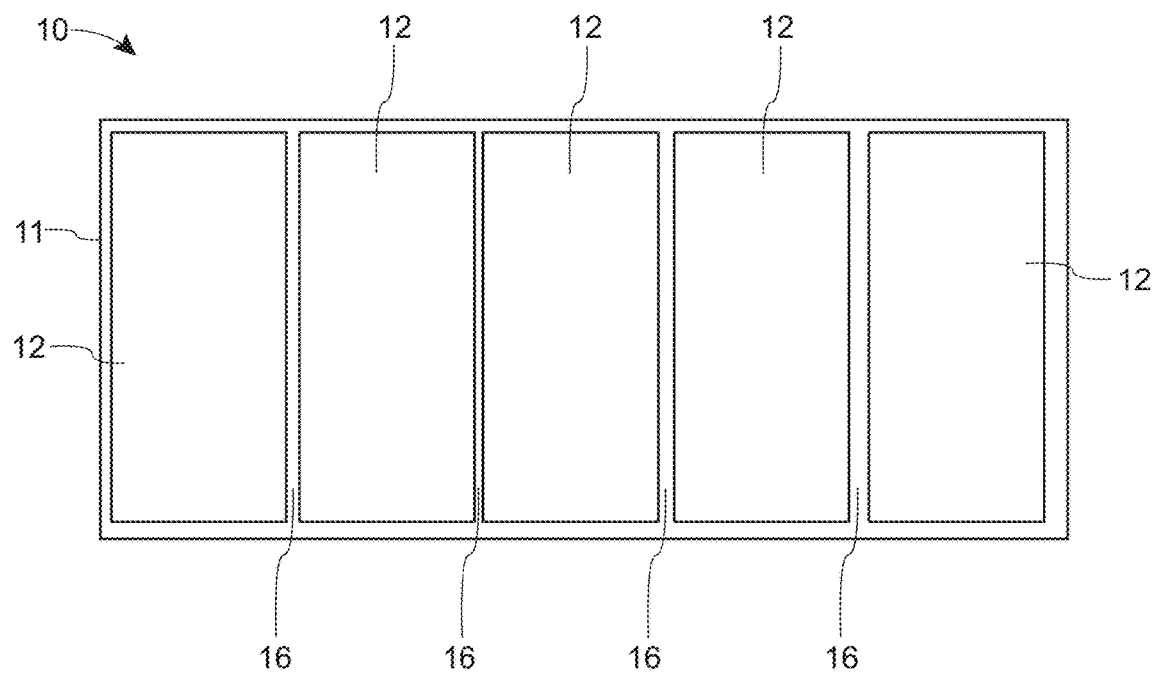

FIGS. 1A and 1B illustrate an optoelectronic apparatus 10 in a cross section and a top view, respectively. The optoelectronic apparatus 10 can be, for example, a roof lining, a panoramic roof, a windscreen, a rear window or a side window for a vehicle. The optoelectronic apparatus 10 includes a transparent first cover 11, at least two carriers 12, here several carriers 12 are shown, and a transparent second cover 13.

The first cover 11 is made of glass and has a thickness, for example, in the range from 3 mm to 4 mm. The upper surface of the first cover 11 in FIG. 1A forms the outer surface of the optoelectronic apparatus 10 facing to the outside of the vehicle.

The carriers 12 are mounted on the first cover 11 and are arranged next to each other. The carriers 12 are aligned as illustrated in FIG. 1B.

The second cover 13 is attached to the carriers 12. The second cover 13 may be made of glass or a plastic material and may have a smaller thickness than the first cover 11.

Figure 1C:
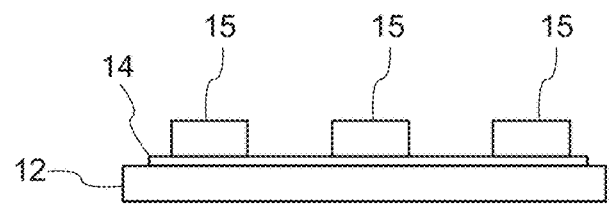
FIG. 1C a schematic representation of a carrier with LEDs attached to the first cover.

One of the carriers 12 is exemplarily illustrated in an enlarged view and in cross section in FIG. 1C. The carrier 12 is made of a flexible foil. One or several electrically conductive layers 14 are deposited on the carrier 12 in order to provide electrical contact and redistribution for optoelectronic elements in the form of LEDs 15 mounted on the electrically conductive layers 14. The LEDs 15 are configured to emit light of a given wavelength range. The LEDs 15 are arranged in an array on the carrier 12.

As can be seen from FIGS. 1A and 1B gaps 16 occur at the interface between adjacent carriers 12. In the optoelectronic apparatus 10 the gaps 16 are filled with air or vacuum. The gaps 16 are visible for a viewer due to different optical transmittances of the carriers 12 and the air or vacuum filling the gaps 16.

Figure 2A:
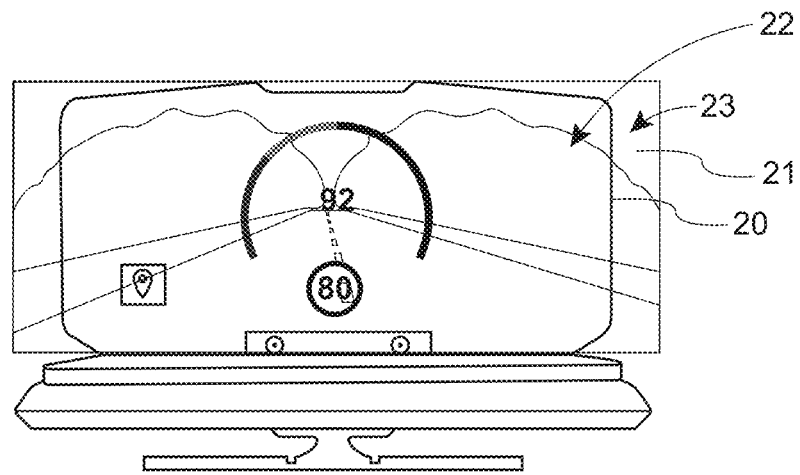
FIGS. 2A and 2B schematic representations of head up display in a windscreen during day time and night.
Figure 2B:
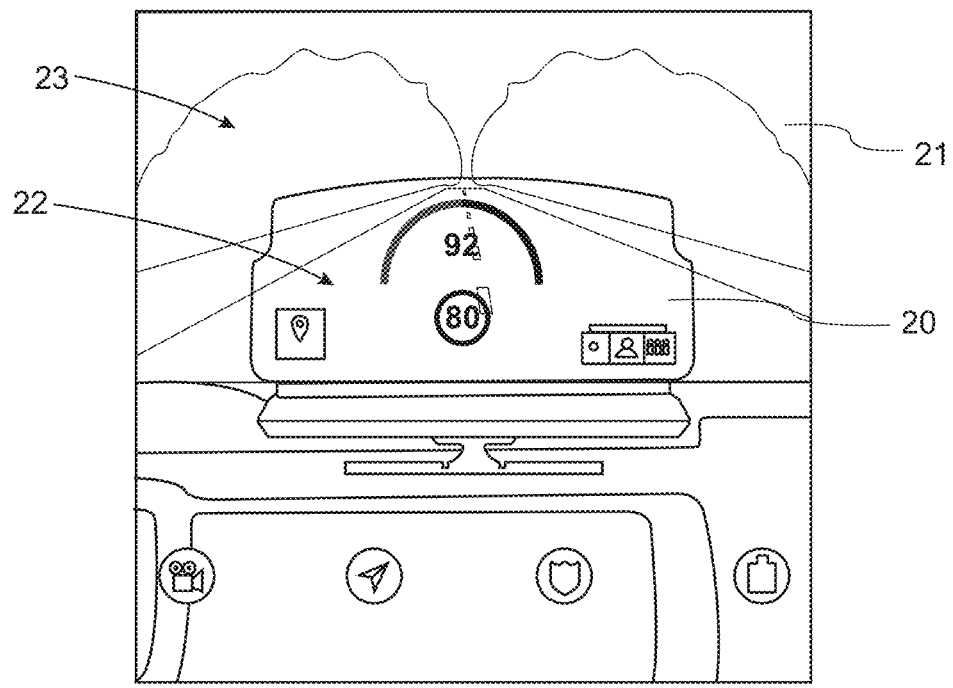

FIGS. 2A and 2B show an example of a head up display 20 integrated into a windscreen 21 of a vehicle during day time and night, respectively. The head up display 20 includes a foil with LEDs attached to the foil. Regions 22 of the windscreen 21 where the head up display 20 is located can be clearly distinguished from regions 23 where the head up display 20 is not located. This due to the different optical transmittances in the regions 22 and 23.

Figure 3:
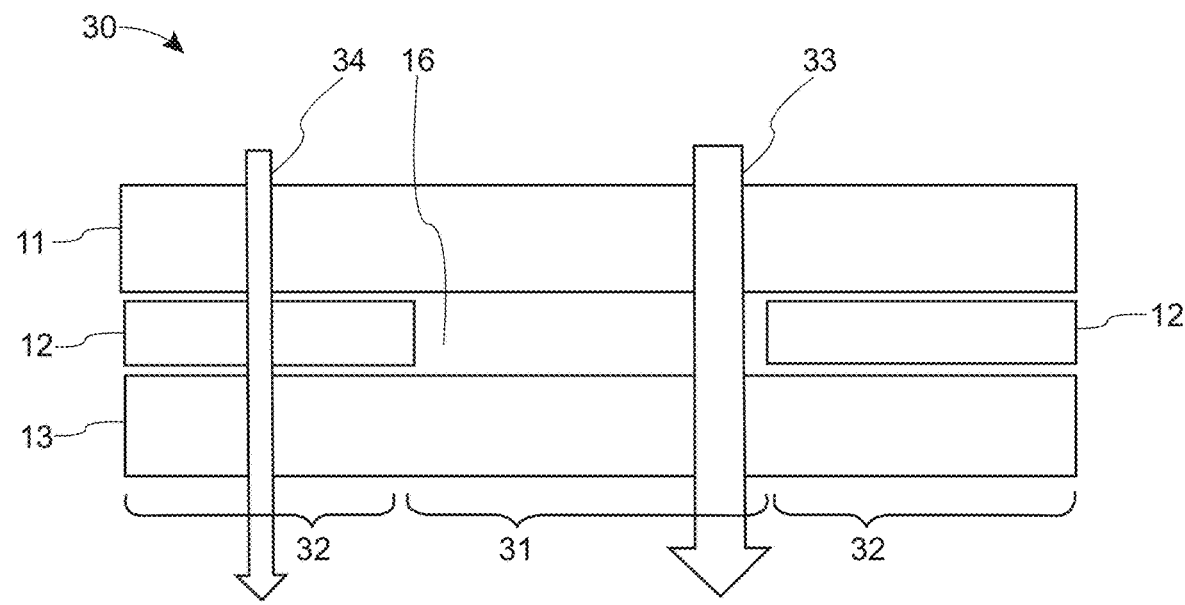
FIG. 3 a schematic representation of an optoelectronic apparatus according to the first aspect.

FIG. 3 illustrates an optoelectronic apparatus 30 in a cross section as an exemplary embodiment according to the first aspect of the application, which can be manufactured by using a method according to the fifth aspect of the application.

The optoelectronic apparatus 30 includes a transparent first cover 11, several carriers 12 and a second cover 13, which are arranged in the same way as in the optoelectronic apparatus 10 shown in FIGS. 1A and 1B. Further, LEDs 15, which are not shown in FIG. 3, are mounted on the carriers 12 as illustrated in FIG. 1C. A gap 16 occurs between adjacent carriers 16, which may be filled with air or vacuum.

In case the optoelectronic apparatus 30 is a window of a vehicle, the second cover 13 may face to the interior of the vehicle.

The optical transmittance of the optoelectronic apparatus 30 is higher in regions 31 where the gaps 16 are located than in regions 32 where the carriers 12 are located as indicated in FIG. 3 by arrows 33 and 34, respectively. The thickness of the arrows 33, 34 is related to the optical transmittance in the respective region 31, 32.

In order to conceal the different optical transmittances in the regions 31, 32, the second cover 13 has a lower optical transmittance than the first cover 11 and/or the carriers 12.

The reduced optical transmittance of the second cover 13 may be achieved, for example, by dots or a pattern printed on the second cover 13 or by light absorbing particles contained in the second cover 13.

The optical transmittance may be reduced homogeneously over the second cover 13 or may vary, for example, by dithering which varies the density of the dots printed on the second cover 13.

For example, the optical transmittance of the second cover 13 may be reduced in the regions 31 where the gaps 16 are located compared to the optical transmittance of the second cover 13 in the regions 32 where the carriers 12 are located.

Figure 4A:
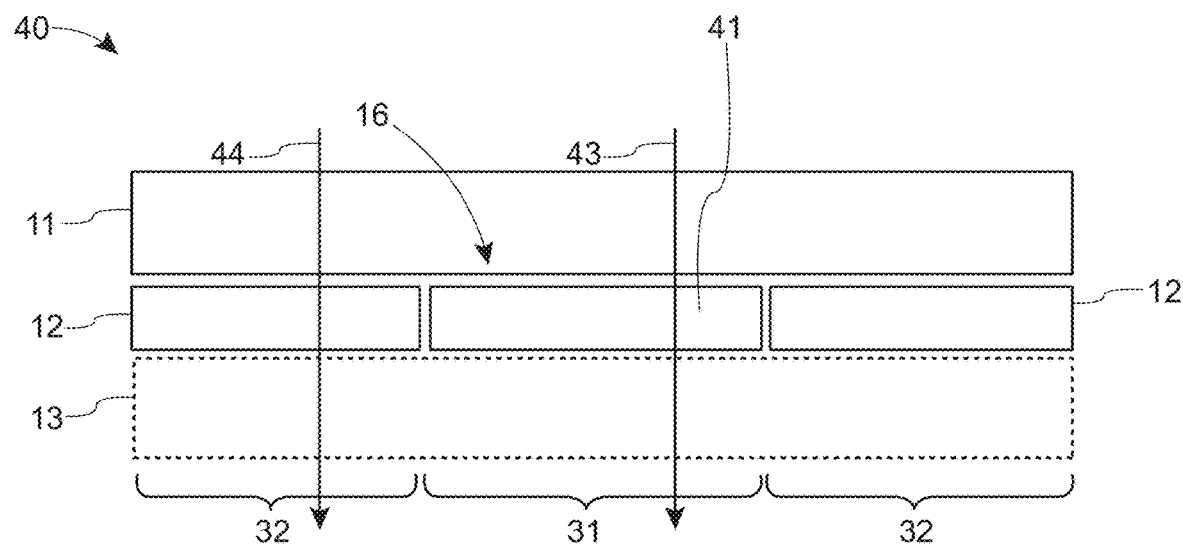
FIGS. 4A and 4B schematic representations of an optoelectronic apparatus according to the second aspect.

FIG. 4A illustrates an optoelectronic apparatus 40 in a cross section as an exemplary embodiment according to the second aspect of the application. The optoelectronic apparatus 40 can be manufactured by using a method according to the sixth aspect of the application.

The optoelectronic apparatus 40 includes a transparent first cover 11, several carriers 12 with LEDs 15 and a transparent second cover 13, which are arranged in the same way as in the optoelectronic apparatus 10 shown in FIGS. 1A to 1C.

In the optoelectronic apparatus 40 the gaps 16 between adjacent carriers 16 are filled with a material 41 having an optical transmittance identical or similar to the optical transmittance of the carriers 12 and/or a refraction index identical or similar to the refraction index of the carriers 12. The material 41 makes the interface between two adjacent carriers 12 less visible and reduces reflections occurring at the interface.

If the carriers 12 and the material 41 have the same optical transmittance, the optical transmittance in regions 31 where the gaps 16 are located is identical to the optical transmittance in regions 32 where the carriers 12 are located. This is indicated in FIG. 4A by arrows 43 and 44 having the same thickness, wherein the arrow 43 represents the optical transmittance in the regions 31 and the arrow 44 represents the optical transmittance in the regions 32.

The material 41 may be deposited in the gaps 16 by using dispensing, screen printing, spraying, in particular through a mask, or any other suitable method. After the material 41 has been deposited in the gaps 16, material 41 protruding from the gaps 16 may be removed in order to create a smooth surface.

Figure 4B:
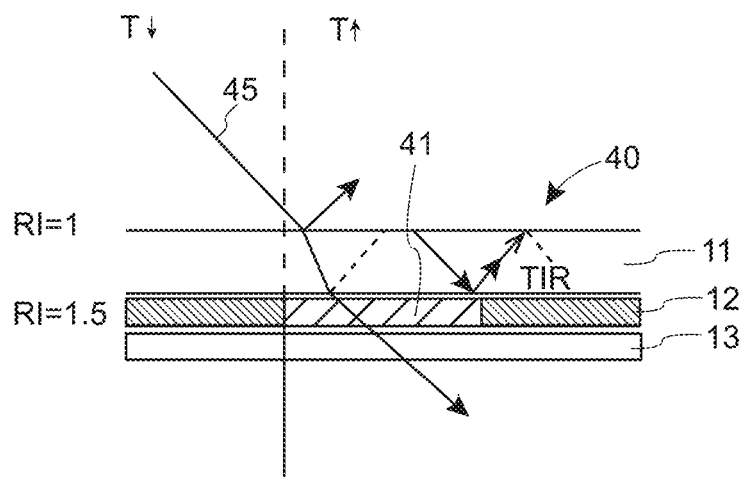

FIG. 4B schematically illustrates a beam of light 45 passing through the optoelectronic apparatus 40. The air outside the optoelectronic apparatus 40 has a refraction index RI equal to 1, whereas the first cover 11 has a refraction index RI equal to 1.5, wherein glass may have a refraction index in the range from 1.45 to 2.14. The carriers 12, the second cover 13 and the material 41 have a refraction index that is higher or lower than the refraction index of the first cover 11.

Figure 5:
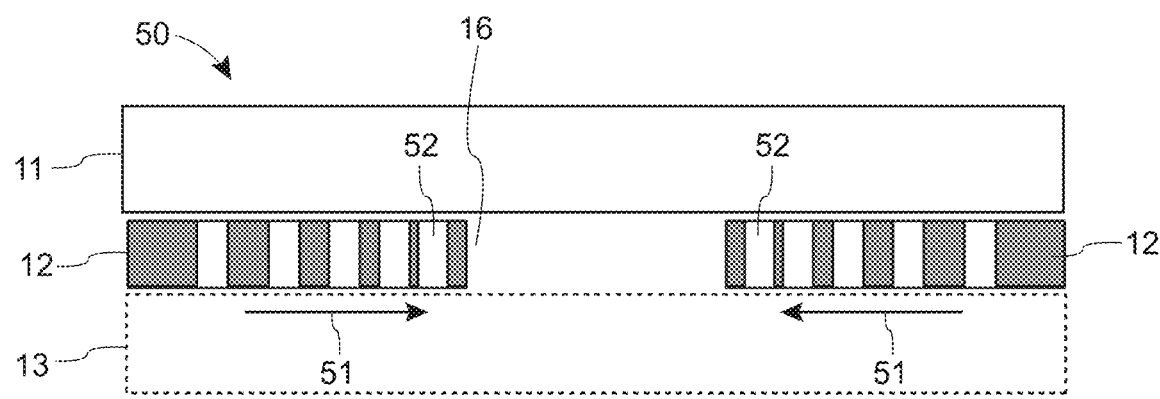
FIG. 5 a schematic representation of an optoelectronic apparatus according to the third aspect.

FIG. 5 illustrates an optoelectronic apparatus 50 in a cross section as an exemplary embodiment according to the third aspect of the application. The optoelectronic apparatus 50 can be manufactured by using a method according to the seventh aspect of the application.

The optoelectronic apparatus 50 includes a transparent first cover 11, several carriers 12 with LEDs 15 and a transparent second cover 13, which are arranged in the same way as in the optoelectronic apparatus 10 shown in FIGS. 1A to 1C.

In the optoelectronic apparatus 50 the optical transmittance of each of the carriers 12 is varied in the direction of the gap 16 between the carriers 12. In particular, the optical transmittance of each of the carriers 12 is increased in the direction of the gap 16, which is indicated by arrows 51 in FIG. 5. Thus, the optical transmittance of the carriers 12 is high adjacent to the gap 16 and is lower further away from the gap 16. This helps to make the transition from the carrier to the gap less visible or softer for a viewer. The gap 16 may be filled with air, vacuum or the material 41 shown in FIG. 4A.

In order to vary the optical transmittance of the carrier 12, a perforation containing several holes 52 is punched into the carriers 12. Close to the gaps 16 the density of the holes 52 is increased compared to regions further away from the gaps 16.

Figure 6:
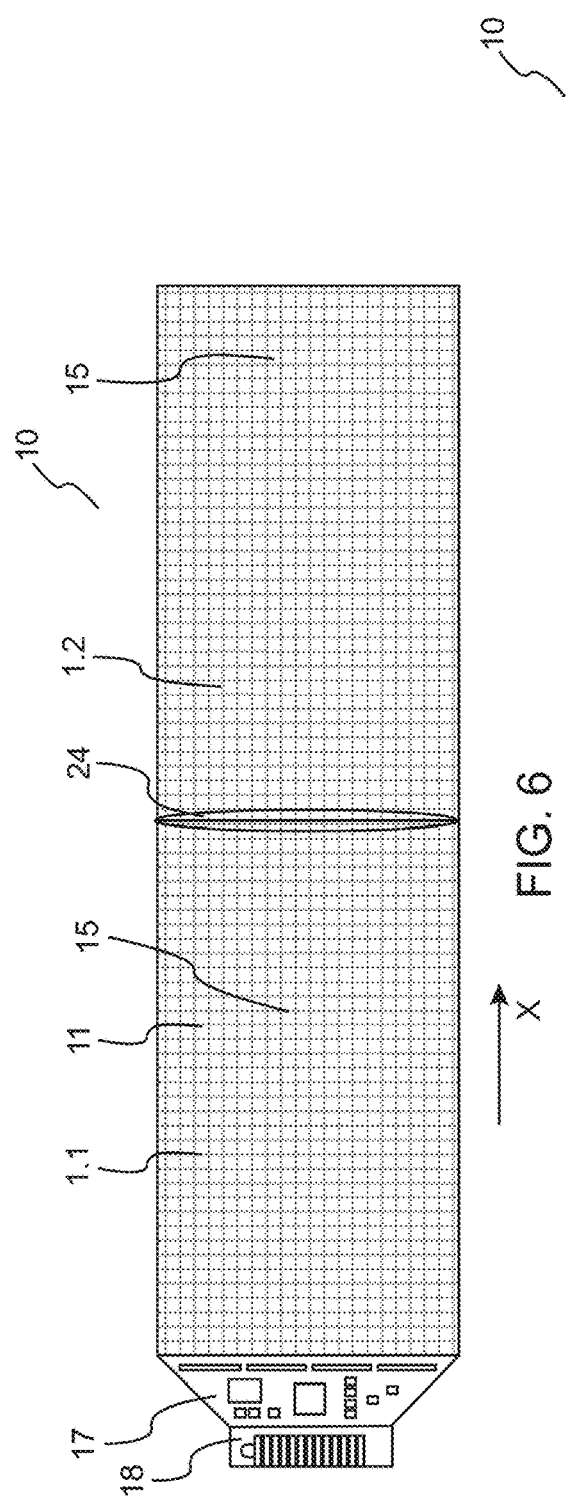
FIG. 6 a schematic representation of an optoelectronic apparatus in accordance with the present invention.

FIG. 6 illustrates an optoelectronic apparatus 10 in a top view. The optoelectronic apparatus comprises a transparent first cover 11, a first layer segment 1.1, in particular intermediate layer segment, arranged on the transparent first cover 11 and comprising optoelectronic elements 15 and a second layer segment 1.2, in particular intermediate layer segment, arranged on the transparent first cover adjacent to the first layer 1.1 segment along a first direction x. The first and the second layer segment are joined together along the first direction x by a melted and resolidified material optoelectronic apparatus 10, when seen in a top view.

The optoelectronic apparatus 10 further comprises a connector area 18 and a programming area 17 being arranged adjacent to the first layer 1.1 segment along the first direction x opposite to the second layer segment 1.2 and being electrically coupled to the optoelectronic elements 15 to control the optoelectronic elements and supply energy to them.

According to this embodiment, the second layer segment may also comprise optoelectronic elements 15 being coupled to the connector 18 and programming area 17.

Figure 7:
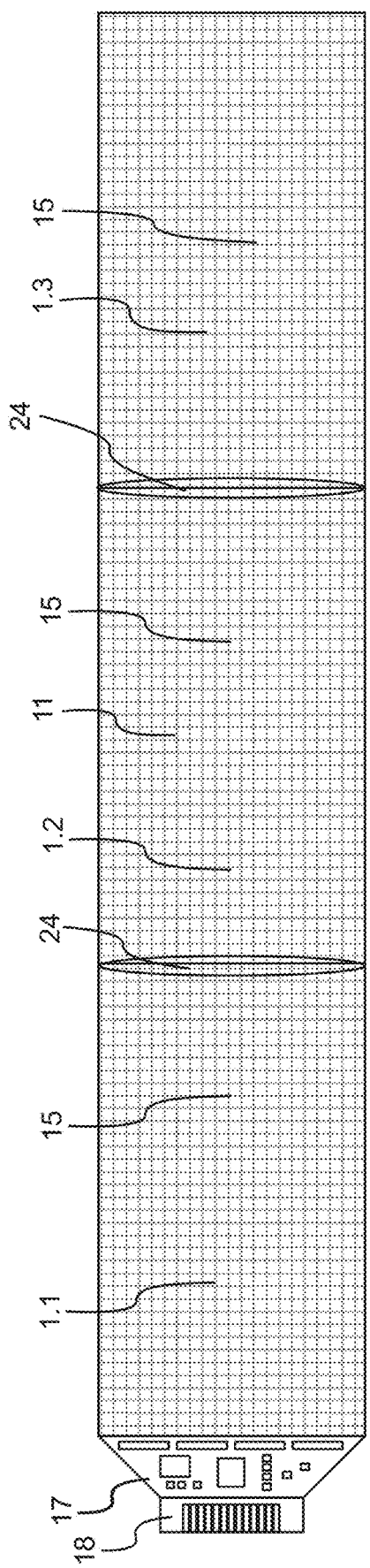
FIG. 7 a schematic representation of another optoelectronic apparatus in accordance with the present invention.

FIG. 7 illustrates an optoelectronic apparatus 10 in a top view, which compared to the optoelectronic apparatus 10 in FIG. 6 comprises a further third layer segment 1.3, in particular intermediate layer segment, arranged on the transparent first cover 11 adjacent to the second layer segment 1.2 along a first direction x. The third layer segment may also comprise optoelectronic elements 15 being coupled to the connector and programming area.

Figure 8:
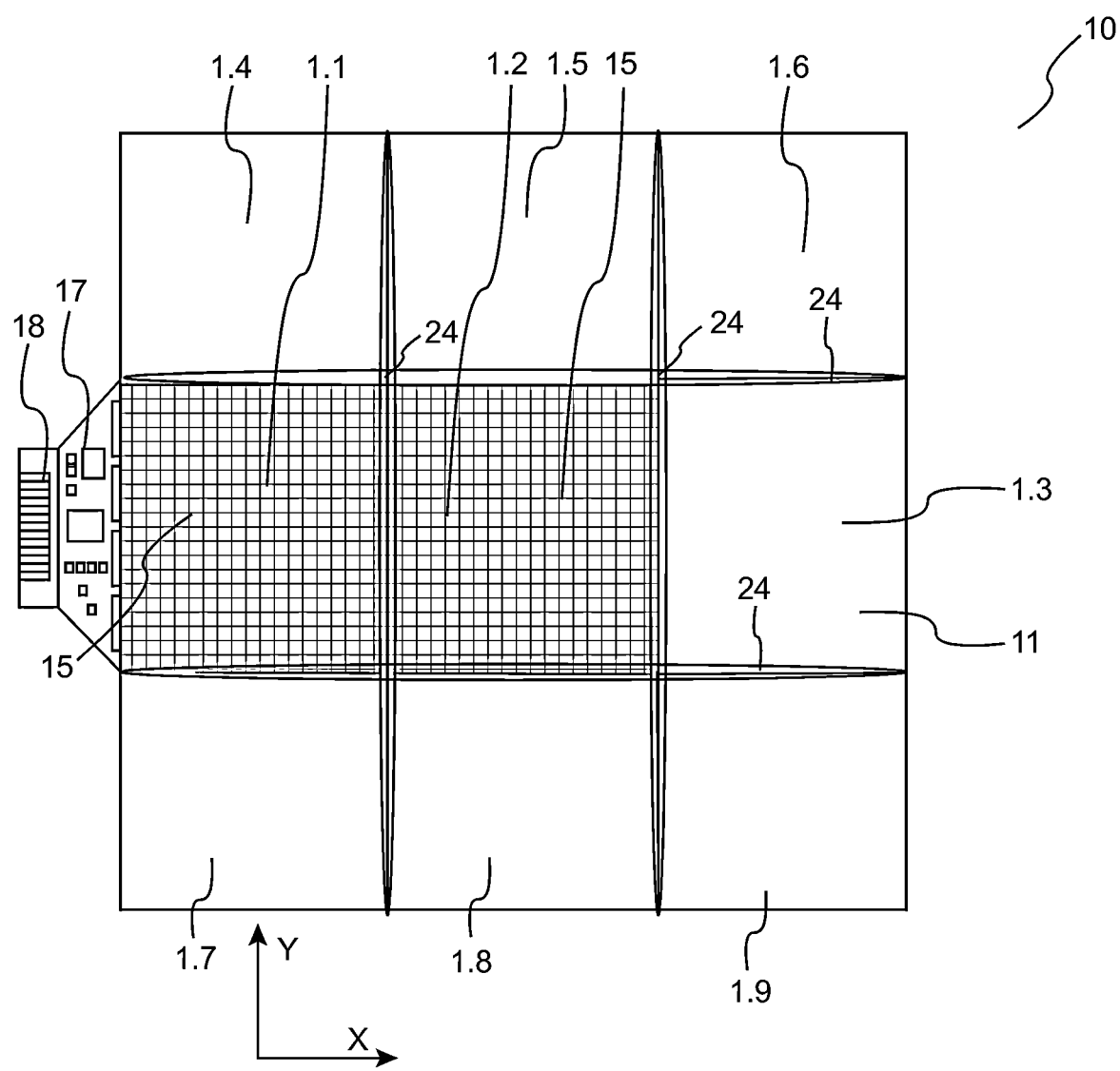
FIG. 8 a schematic representation of another optoelectronic apparatus in accordance with the present invention.

Referring now to FIG. 8, the optoelectronic apparatus 10 of FIG. 6 comprises a further third layer segment 1.3, in particular intermediate layer segment, arranged on the transparent first cover 11 adjacent to the second layer segment 1.2 along a first direction x. The third layer segment 1.3 may however comprise no optoelectronic elements being arranged on it. The optoelectronic apparatus 10 further comprises two rows of each three layer segments 1.4 & 1.5 & 1.6, 1.7 & 1.8 & 1.9 being arranged adjacent to the first second and third layer segment 1.1, 1.2, 1.3 along a second direction y, wherein the second direction y is oriented perpendicular to the first direction x. One row 1.4 & 1.5 &

1.6 is thus being arranged above the first, second and third layer segment and one row 1.7 & 1.8 & 1.9 being arranged below the first, second and third layer segment. The two rows of layer segments comprise no optoelectronic elements.

The layer segments can all be of the same size as shown for example in FIG. 8 but can also vary in size and shape. The layer segments can for example comprise a rectangular, quadratic, triangular, hexagonal, or any other comparable form.

Such a modular approach allows forming a larger layer, for example a so-called intermediate layer, between a transparent first cover and a transparent second cover. Thus, a large surface area that corresponds to the larger layer can be formed by use of the layer segments that are joined together along the first and/or the second direction. Such a larger layer arranged between a transparent first cover and a transparent second cover, in particular glass plates, can form an optoelectronic system.

The optoelectronic system can form an at least partially transparent pane of a vehicle, particularly a windshield or a window of a vehicle. Accordingly, the pane and particularly the windshield or window comprises optoelectronic elements to enlighten the pane at least partially and/or to display information on at least parts of the pane.

As illustrated in FIGS. 6 and 7, the optoelectronic elements 15 can be distributed over the whole surface area of the optoelectronic apparatus 10, and thus the whole area can be enlightened and/or information can be displayed on the whole area. Whereas according to FIG. 8 only the left middle part—first and second layer segment 1.1, 1.2—of the optoelectronic apparatus comprises optoelectronic elements 15 to enlighten parts of the optoelectronic apparatus and/or to display information on parts of the optoelectronic apparatus. In case of a windshield of a vehicle, this area might for example be within the line of sight of a driver of the vehicle, to provide information to the driver by displaying it on the windshield.

Referring now to FIGS. 9A and 9B, two steps of manufacturing an optoelectronic apparatus are shown. In a first step (see FIG. 9A), a temporary carrier layer 19 is provided, and a first layer segment 1.1 is arranged on the temporary carrier layer 19, wherein the first layer segment 1.1 comprises at least one optoelectronic element 15. A second layer segment 1.2 is arranged adjacent to the first layer segment 1.1 along a first direction x on the temporary carrier layer 19, wherein the first and second layer segment comprise an approximately similar refractive index. The first and the second layer segment 1.1, 1.2 are arranged adjacent to each other such that a gap 16 of a predefined distance d is formed between the first and the second layer segment. The predefined distance is particularly chosen according to the flow behavior of the material of the first and second layer segment, but is particularly smaller than 1 mm.

In a next step (see FIG. 9B), the first and second layer segment 1.1, 1.2 are joined together, such that a melted and resolidified material 24 is arranged between adjacent edges of the first and second layer segment along the first direction x. The step of joining the first and second layer segment together comprises heating at least the boundary regions of the first and second layer segment. When heating the material of the boundary region melts and flows into the gap 16 between the first and second layer segment. The heating itself is spatially limited such that only material close to the gap and the boundary region is melted.

After the material is heated and flown into the gap, the heating is stopped and the material solidifies again now forming a joint between the two layers. Consequently, the melted and resolidified material 24 is formed of the material of the first and second layer segment 1.1, 1.2.

FIG. 10A shows an alternative manufacturing approach. Here, second layer 1.2 is arranged such that it partially overlaps first layer 1.1, thus forming a gap or a hole below layer 1.2 adjacent to the first layer 1.1. The size of the whole may depend on the viscosity of the flexibility of the second layer 1.2 and the height of the first layer for example. In some aspects, the gap can be smaller, if the second layer is pushed down adjacent to the first layer before the melting process is activated. Then, the crinkle or dog-ear as shown in FIG. 10A becomes more steep.

The step of joining the first and second layer segment together (see FIG. 10B) then comprises heating at least the overlapping part of the second layer segment. When heating the material of the overlapping part of the second layer segment melts and flows into the gap 16 between the first and second layer segment. The heating itself is spatially limited such that only material close to the gap and the boundary region is melted. After the material is heated and flown into the gap, the heating is stopped and the material solidifies again now forming a joint between the two layers. Hence, the material of the overlapping part of the second layer segment forms the melted and resolidified material 24. The melted and resolidified material 24 can, as illustrated in the FIG. 10B, form an accumulation of excess material above the joint region of the first and second layer segment. However, depending on the size of the gap 16 and the size of the overlapping part of the second layer segment, the melted and resolidified material 24 can also form a planar surface with the first and second layer segment or form a ditch between the first and second layer segment.

Figure 11A:
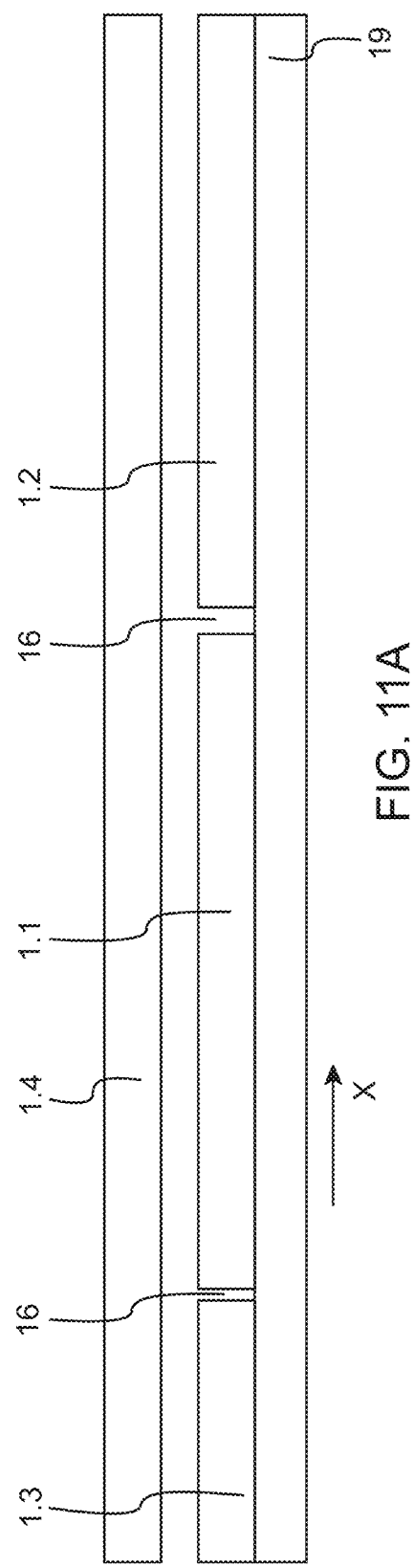
FIGS. 11A and 11B cross sectional views of steps of a method to manufacture another optoelectronic apparatus in accordance with the present invention.

Referring now to FIG. 11A, the method shown in FIG. 9A further comprises arranging a third layer segment 1.3 adjacent to the first layer segment 1.1 along the first direction x on the temporary carrier layer 19 opposite to the second layer segment 1.2, as well as arranging a fourth layer segment 1.4 on top of the first, second and third layer segment 1.1, 1.2, 1.3. The third layer segment is arranged adjacent to the first layer segment such that a gap 16 is formed between the two layer segments.

Figure 11B:
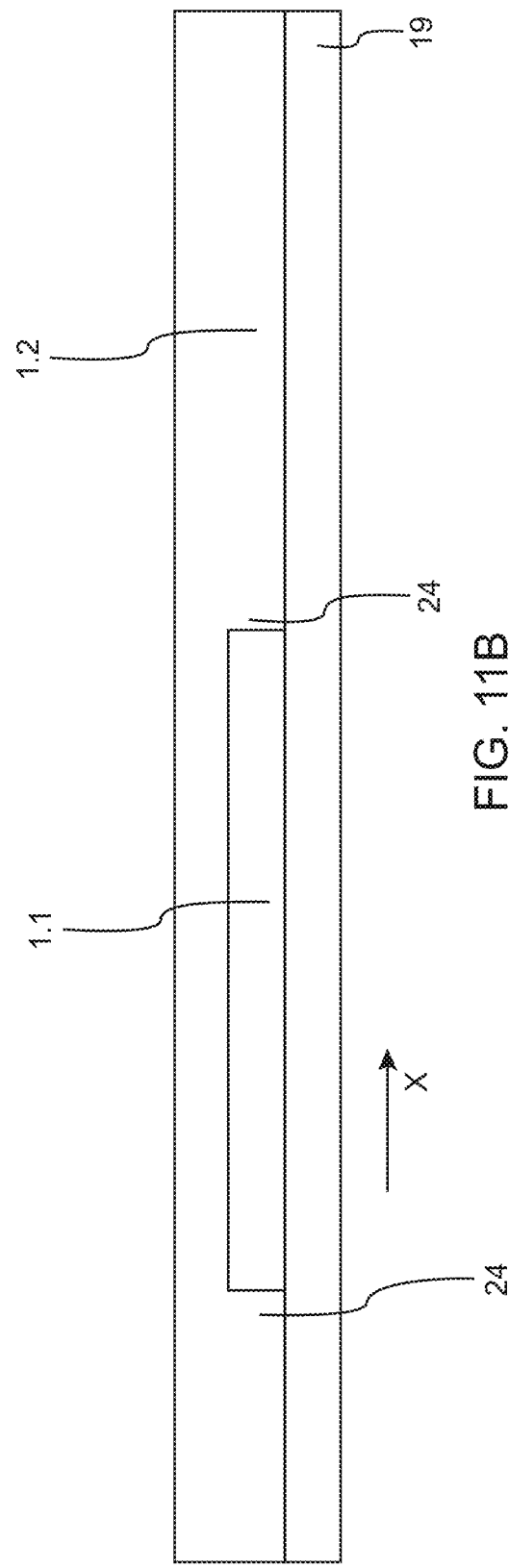

FIG. 11B illustrates a step of joining the first, second, third and fourth layer segment together. Therefore, the whole optoelectronic apparatus is for example placed into an oven such that the material of the second, third and fourth layer segment starts melting or at least softening. Particularly the melting temperature of the material of the second, third and fourth layer segment is different, particularly lower than the material of the first layer segment, such that the second, third and fourth layer segment connects with each other at their adjacent edges, particularly flows into each other, while the material of the first layer segment stays solid. After the material of the second, third and fourth layer segment is heated and flown into each other, the heating is stopped and the material solidifies again now forming joint between the three layer segments covering the first layer segment. Hence, the material of the adjacent edges of the second, third and fourth layer segment forms the melted and resolidified material 24 such that the melted and resolidified material is arranged between adjacent edges of the first, second, third and fourth layer segment. As shown in the figure, the first layer segment is completely covered with the second, third and fourth layer segment.

FIGS. 12A to 12C illustrate a method of joining two layer segments by use of an additional material. The additional material can for example be of the same material as the layer segments but can also vary to that. As sown in FIG. 12A, a first and a second layer segment 1.1, 1.2 are arranged adjacent to each other along a first direction x on a temporary carrier layer 19 such that a gap 16 is formed between the two layer segments.

In a next step (see FIG. 12B), the additional material is provided on and into the gap 16 in form of for example a solution within a desired solvent or in a melted form. In a further step (see FIG. 12C) the additional material is then cured or further processed by use of for example an oven, wherein the curing or the further processing can for example be per-formed in vacuum atmosphere. The material in the gap solidifies and forms a tight joint between first and second layer.

Figures 13A, 13B:
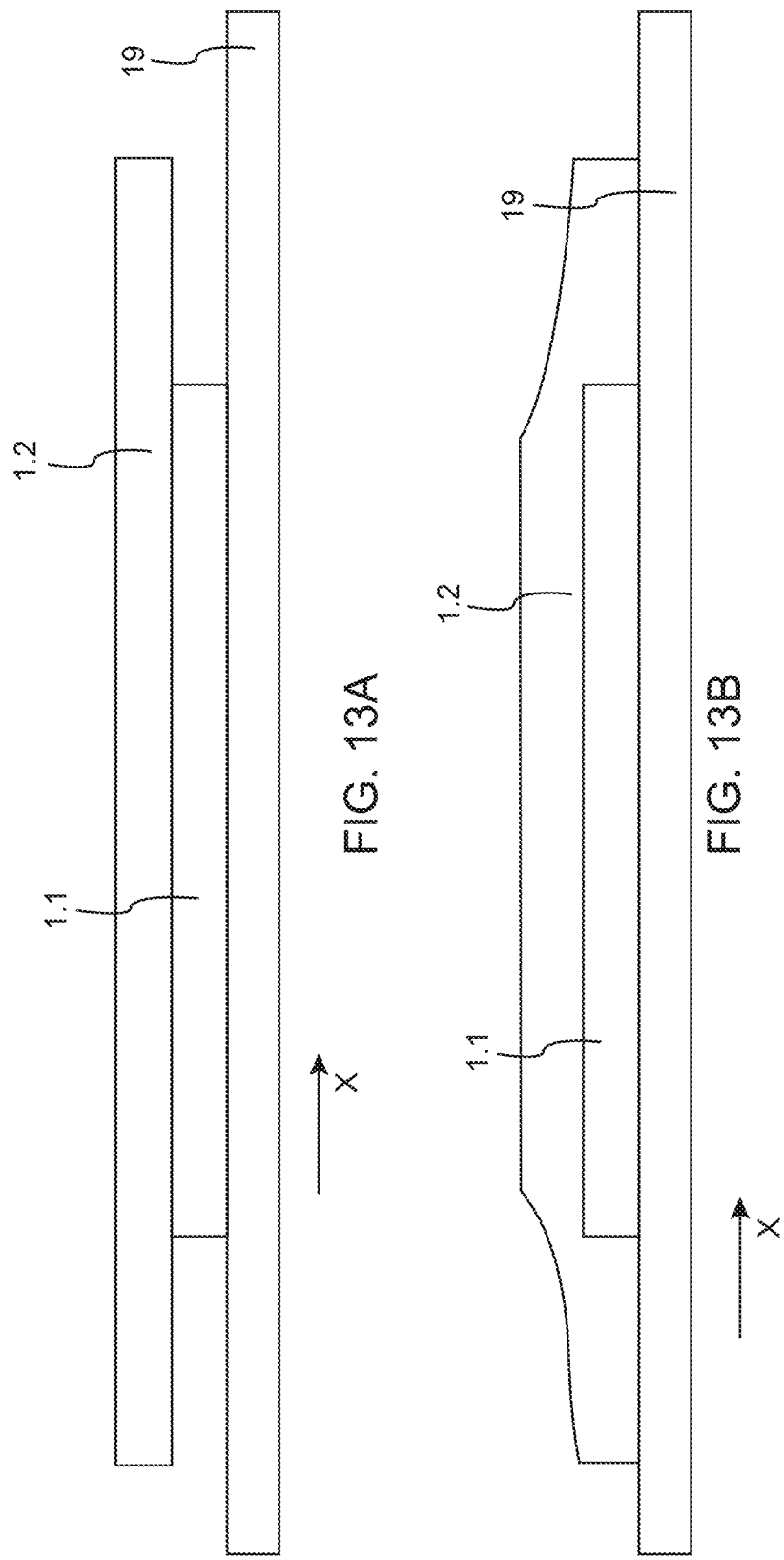
FIGS. 13A and 13B cross sectional views of steps of another method to manufacture an optoelectronic apparatus in accordance with the present invention.

Referring now to FIGS. 13A to 14B, another method for manufacturing an optoelectronic apparatus is illustrated. As shown in FIGS. 13A and 14A the method comprises the step of providing a temporary carrier layer and arranging a first layer segment comprising at least one optoelectronic element on the temporary carrier layer. A second layer segment is then arranged on the first layer segment such that the second layer segment is overlapping at least one edge region of the first layer segment. In case of the method illustrated in FIG. 13A, the second layer segment 1.2 has a size, which is larger than the size of the first layer segment 1.1, such that the second layer segment overlaps all edge regions of the first layer segment and thus extends at least partially over the edges of the first layer.

In case of the method illustrated in FIG. 14A, the second layer segment 1.2 has a size, which is larger than the size of the first layer segment 1.1, such that the second layer segment overlaps all edge regions of the first layer segment, but a center region of the second layer segment is removed, such that the second layer segment comprises a ring-like form.

As schematically shown in FIGS. 13B and 14B the first and second layer segment are joined together by melting and solidifying a material between adjacent edges of the first and second layer segment or by deep drawing the second layer segment such that the second layer segment nestles up to the contour of the first layer segment.

Figure 15:
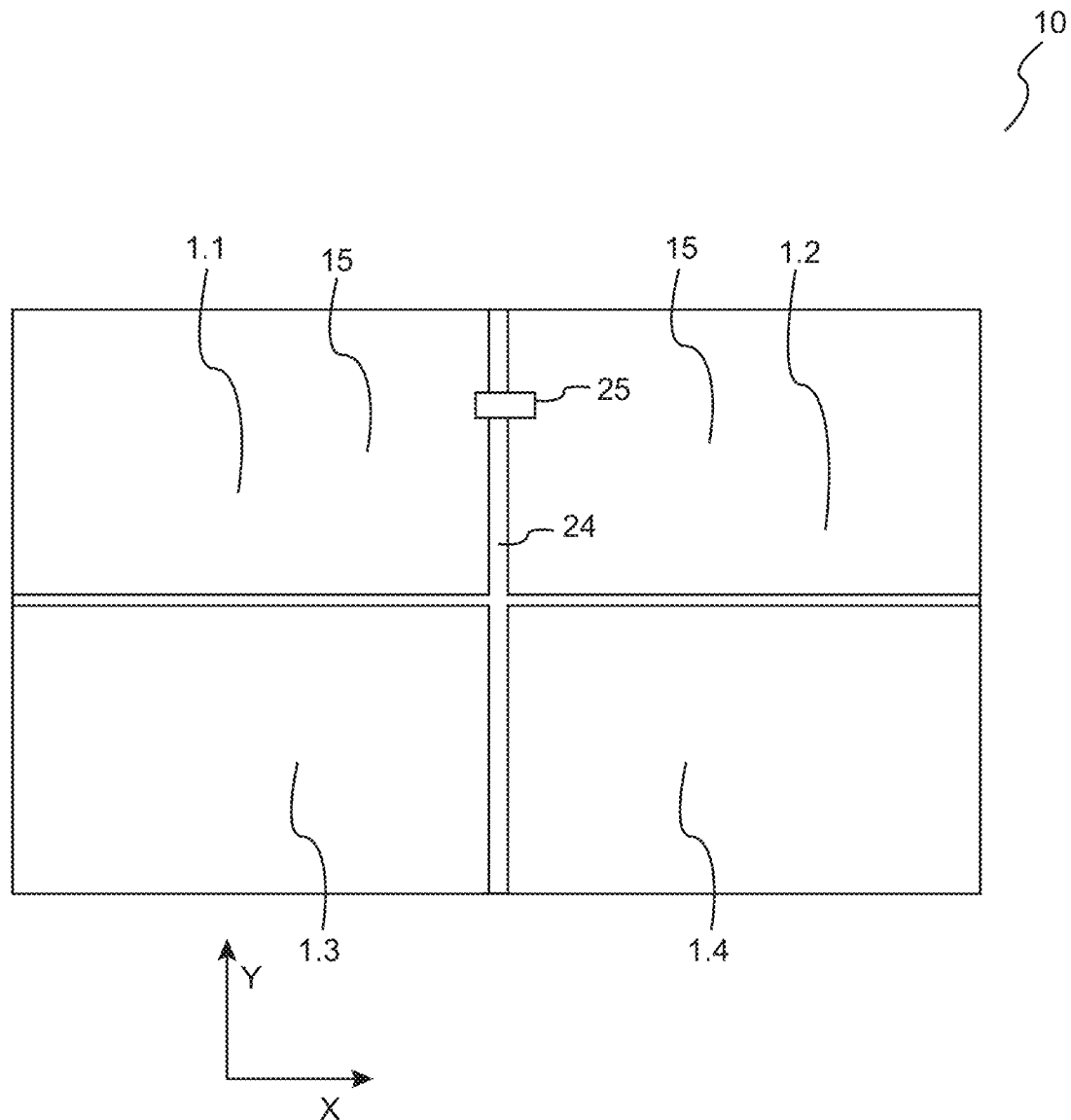
FIG. 15 a top view of an optoelectronic apparatus in accordance with the present invention.

FIG. 15 illustrates a top view of an optoelectronic apparatus 10 comprising four layer segments joined together along a first direction x and a second direction y by a melted and resolidified material 24. The first and second layer segment each comprise optoelectronic elements 15 which are coupled via an electric bridging 25 element which extends between the first and the second layer segment.

Figures 16A, 16B:
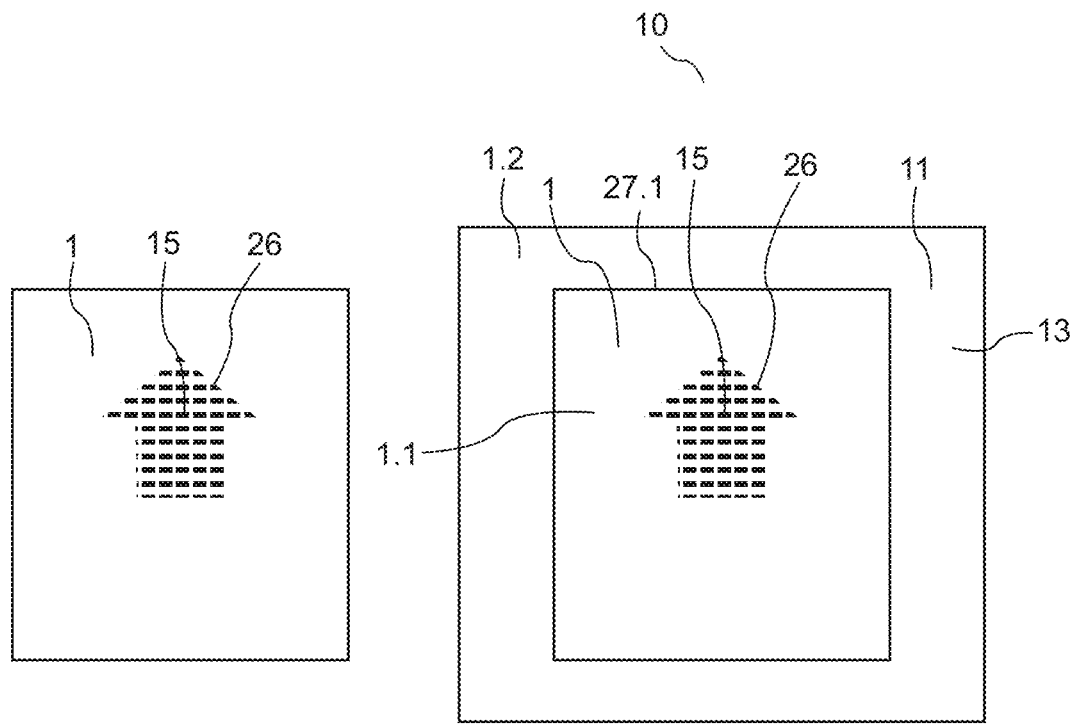
FIG. 16A a schematic representation of an intermediate layer equipped with an arrangement of optoelectronic light sources.
FIG. 16B a schematic representation of an intermediate layer equipped with an arrangement of optoelectronic light sources arranged between a first and a second cover.

FIG. 16A shows a top view of an intermediate layer 1 equipped with an arrangement of optoelectronic light sources 15. The arrangement of optoelectronic light sources 15 has a defined shape with a defined contour 26 as for example a symbol or an indicator. Here, the symbol or indicator has the shape of an arrow. The arrangement of optoelectronic light sources 15 can be embedded in the intermediate layer 1 or can be arranged on an upper surface area of the intermediate layer 1. However the arrangement of optoelectronic light sources 15 covers only a portion of the upper surface area of the intermediate layer 1. Within this portion of the surface area, particularly within the defined contour 26, the optoelectronic light sources 15 are distributed equally on the surface area to obtain a desired resolution of the symbol or indicator.

In the optoelectronic apparatus 10 of FIG. 16B the intermediate layer 1 is arranged between a first cover 11 and a second cover 13. As shown in the figure, the size of the upper surface area of the intermediate layer 1 is smaller than the size of the first and second cover 11, 13. However, the size of the upper surface area of the intermediate layer 1 can be at least approximately equal to the size of the first and second cover 11, 13. In the example shown, the intermediate layer forms a first layer segment 1.1, which is surrounded by a second layer segment 1.2 within the same layer. The first and the second layer segment 1.1, 1.2 are together at least approximately equal to the size of the first 11 and second cover 13. The first and the second layer segment 1.1, 1.2 can for example comprise two different materials so that they comprise different refractive indices. However, the first and the second layer segment can comprise similar materials and a boundary region between the first and the second layer segment, particularly along a first edge 27.1 of the first layer segment, comprises scattering particles, defects or voids such as to scatter light propagating through the first layer segment. The first edge 27.1 is particularly the outer contour of the first layer segment 1.1.

Figure 16C:
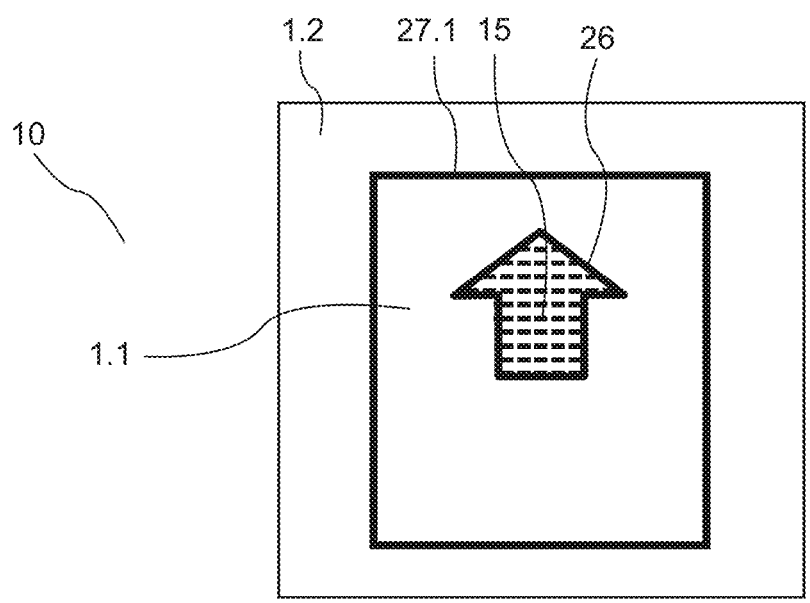

FIG. 16C shows a top view of the optoelectronic apparatus of FIG. 16B in operation. In other words, at least some of the optoelectronic light sources 15 are switched on. As indicated, not only the arrangement of optoelectronic light sources 15 is illuminated, but also the boundary region between the first and the second layer segment is illuminated. This is caused by a propagation of light within the first layer segment 1.1 and an out coupling of the light at a surface side of the first layer segment 1.1, which extends along the first edge 27.1 in a vertical direction. The illumination of the boundary region between the first and the second layer segment can be an undesired light extraction, as it can be perceived as annoying by a user of the optoelectronic apparatus.

Referring now to FIG. 17A, the intermediate layer 1 of FIG. 16A is shown with a cutting line C along the defined contour 26 of the arrangement of optoelectronic light sources 15. By use of a cutting or laser cutting step, a first layer segment 1.1 with the same shape and the same contour 26 as the arrangement of the plurality of optoelectronic light sources 15 is provided. The respective first layer segment 1.1 is shown in FIG. 17B.

The first layer segment 1.1 is arranged between a first cover 11 and a second cover 13, as shown in FIG. 17C, forming an optoelectronic apparatus 10. The first layer segment 1.1 is surrounded by a second layer segment 1.2 within the same layer. The second layer segment 1.2 comprises a second edge 27.2 which is complementary shaped to the contour 26 of the first layer segment 1.1.

Here the second layer segment 1.2 is a hot-melt adhesive layer, such as for example a PVB or EVA layer, arranged on at least one of the first cover 11 and the second cover 13. The and the first layer segment 1.1 is positioned on the second layer segment 1.2 and in particular pressed into the second layer segment 1.2 in a melted or at least softened state of the second layer segment. The second layer segment 1.2 encloses the first layer segment 1.1 in a circumferential direction Y. The second edge 27.2 is complementary shaped to the contour 26 of the first layer segment 1.1 along its complete circumferential length. Thus the second edge 27.2 is adjacent to the contour 26 along its complete circumferential length as the melted or at least softened material of the second layer segment 1.2 follows the contour 26 of the first layer segment.

However, the second layer segment 1.1 can also be formed by a layer with a hole of the shape of the first layer segment 1.1 through the second layer segment 1.2. The second edge 27.2 can thus be defined by the inner contour of the hole such that the second edge 27.2 is complementary shaped to the contour 26 of the first layer segment 1.1. The contour 26 and the second edge 27.2 are both closed in a circumferential direction Y and the second edge 27.2 is complementary shaped to the contour 26 along its complete circumferential length. The first layer segment 1.1 is arranged adjacent to the second layer segment 1.2, particularly in the hole of the second layer segment 1.2 such that the second edge 27.2 is adjacent to the contour 26 along its complete circumferential length.

As an alternative, the first layer segment 1.1 is surrounded by a plurality of second layer segments 1.2 within the same layer, as shown in FIG. 17D. Thus, each second layer segment 1.2 comprises a second edge 27.2, which is complementary shaped to a portion of the contour 26 of the first layer segment 1.1. In other words, the second layer segments 1.2 are arranged adjacent to the first layer segment 1.1 and each second edge 27.2 fits to the portion of the contour 26 of the first layer segment 1.1 as for example puzzle pieces put together.

FIG. 17E shows a top view of the optoelectronic apparatus 10 of FIGS. 17C and 17D in operation, i.e. the optoelectronic light sources 15 are switched on. As indicated, only the arrangement of optoelectronic light sources 15 is illuminated as the boundary region between the first 1.1 and the second layer segment(s) 1.2 correlates to the contour of the arrangement of optoelectronic light sources 15. Due to a gap in the index of refraction at the contour 26, the light can not propagate away from the light sources in the lateral direction. An annoying effect of illumination parts of the optoelectronic apparatus 10 that are located at a distance from the arrangement of the plurality of optoelectronic light sources 15 can thus be avoided.

Figure 18A:
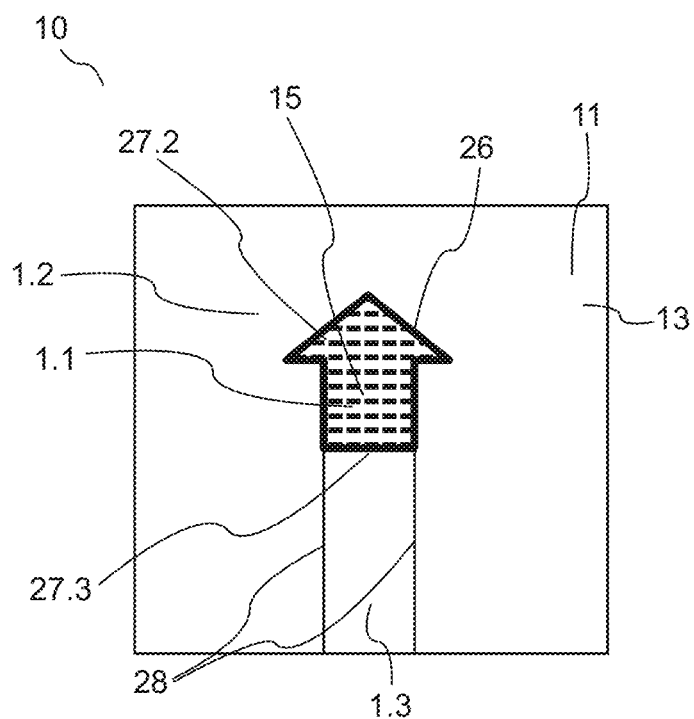
FIG. 18A a schematic representations of another optoelectronic apparatus in accordance with the present invention.

FIG. 18A shows a top view of an optoelectronic apparatus 10 which is similar to the optoelectronic apparatus 10 of FIG. 17C, but further comprises a third layer segment 1.3 in the same layer as the first and second layer segment. The third layer segment 1.3 comprises at least one conductor line and preferably two conductor lines embedded into the third layer segment or arranged on a surface area of the third layer segment 1.3. The one or more conductor lines are configured to supply electric energy and/or an electric signal to the plurality of optoelectronic light sources 15. The third layer segment 1.3 further comprises a third edge 27.3, which is complementary shaped to a second portion of the contour 26 of the first layer segment 1.1. The third edge 27.3 is defined by a portion of the outer contour of the third layer segment 1.3 and is complementary shaped to the second portion of the contour 26 of the first layer segment 1.1. In the example shown, the third layer segment 1.3 has a rectangular shape and the third edge is formed by one of the short sides of the rectangle. The second portion of the contour 26 is formed by the base of the arrangement of the optoelectronic light sources 15, particularly the base of the arrow formed by the optoelectronic light sources 15. The third layer segment 1.3 is arranged adjacent to the first layer segment 1.1 such that the third edge 27.3 is adjacent to the second portion of the contour 26. The second layer segment 1.2 encloses the first layer segment 1.1 such that the second edge 27.2 is complementary shaped to the first portion of the contour 26. The second layer segment further encloses the third layer segment, such that adjacent edges of the second and third layer segment are complementary shaped to each other forming a respective boundary region 28. As seen from the figure, one of the outer edges of the third layer segment correlates with an outer edge of the first and/or second cover, however an outer edge of the third layer can extend over the outer edges of the first and/or second cover 11, 13.

Figure 18B:
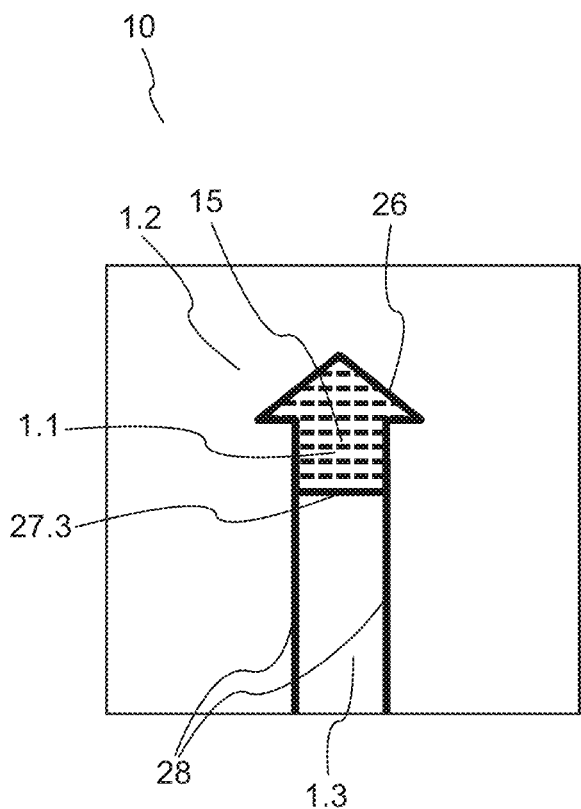
FIGS. 18B and 18C schematic representations of optoelectronic apparatuses in accordance with the present invention when the optoelectronic apparatuses are in operation.

FIG. 18B shows a top view of the optoelectronic apparatus 10 of FIG. 18A in operation. As seen from the figure, not only the arrangement of optoelectronic light sources 15 is illuminated, but also the boundary region 28 between the second and the third layer segment is illuminated. This is caused by a propagation of light within the third layer segment 1.3 and an outcoupling of the light at a surface side of the third layer segment 1.3, which extends along the boundary region 28 in a vertical direction. The illumination of the boundary region 28 can however be an undesired light extraction, as it can be perceived as annoying by a user of the optoelectronic apparatus.

Figure 18C:
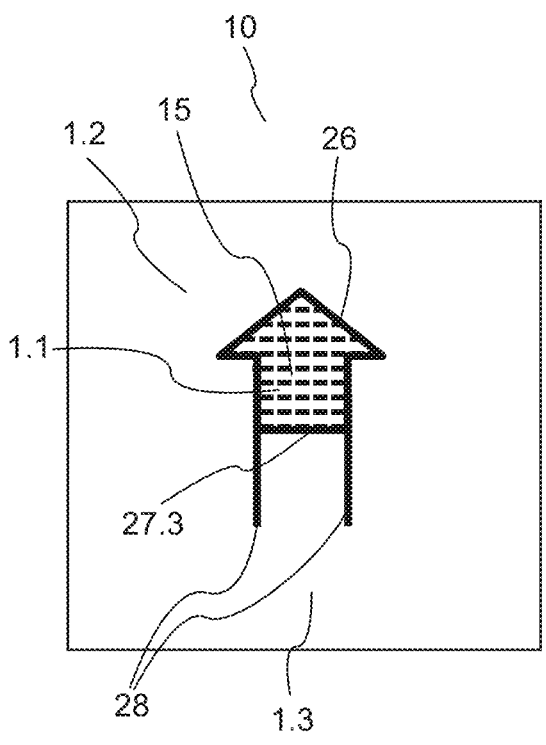

To reduce the illumination of the boundary region 28, at least one and preferably all of the layer segments can consist of a blackened material. The effect of all layer segments consisting of a blackened material is schematically shown in FIG. 18C. Due to the blackened material, the propagation of light within the third layer is reduced and thus the outcoupling of light in the boundary region 28 is reduced as seen from the figure.

Figure 19A:
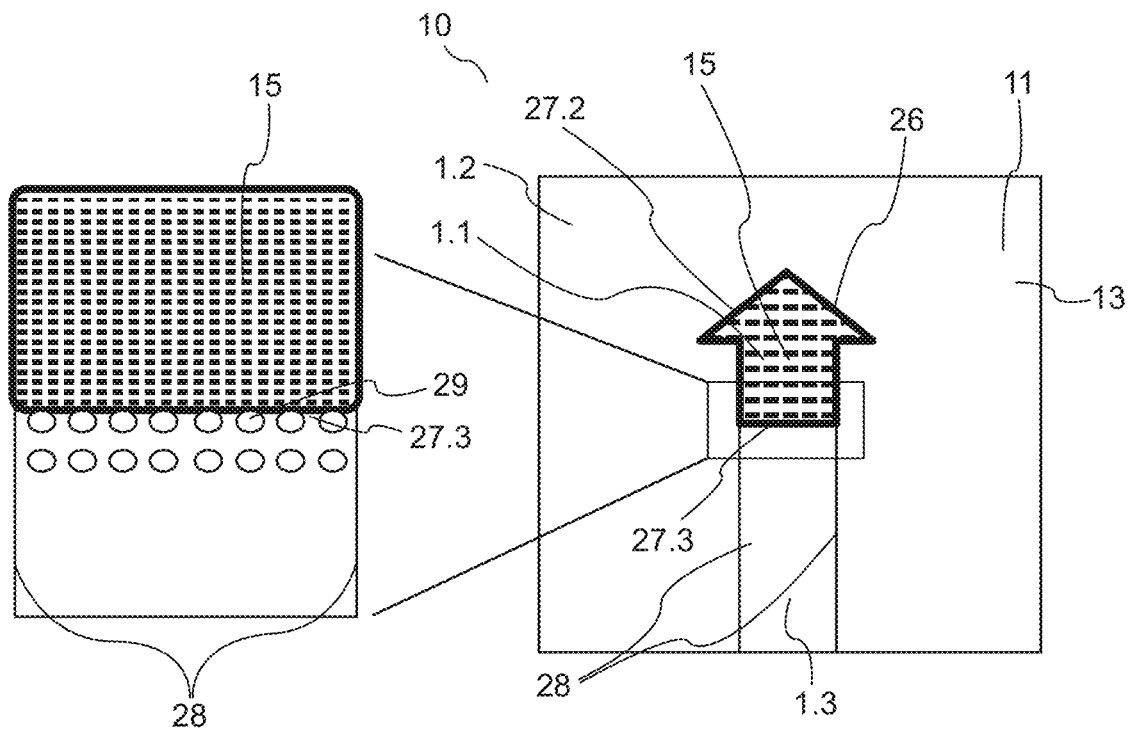
FIGS. 19A and 19B schematic representations of optoelectronic apparatuses in accordance with the present invention when the optoelectronic apparatuses are in operation including a detail view of a contact area between a first and a third layer segment.
Figure 19B:
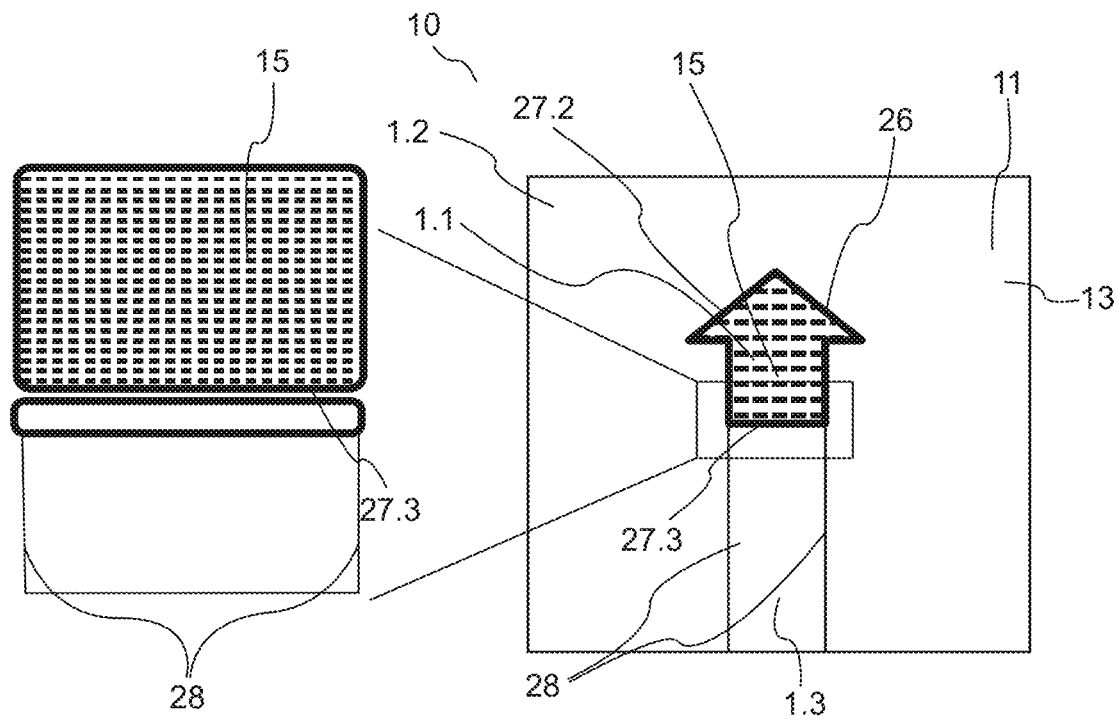

Two further approaches to reduce the illumination of light at the boundary region 28 are shown in FIGS. 19A and 19B. As shown in FIG. 19A a sequence of perforations 29 is generated in the third layer segment 1.3. The sequence of perforations extends adjacent to the third edge 27.3. By producing the sequence of perforations the third edge can get ragged and thus the refractive index difference between the first and the third layer can be increased. Between each two of the perforations, the at least one conductor line can be guided through to still allow electric energy and/or a data signal to be transferred to the plurality of optoelectronic light sources 15.

As shown in FIG. 19B scattering elements, defects and/or voids are provided in a surface side of the third layer segment 1.3. The surface side extends along the third edge 27.3 of the third layer segment in a vertical direction. The scattering elements, defects and/or voids can for example be generated by exposing the surface side, which extends along the third edge 27.3 of the third layer segment in a vertical direction, to laser light.

In the following, various devices and arrangements as well as methods for manufacturing, processing and operating are listed as Items again. The following items present various aspects and implementations of the proposed principles and concepts, which can be combined in different ways. Such combinations are not limited to those given below:

1. An optoelectronic apparatus (30), comprising:
    a transparent first cover (11),
    at least two carriers (12) mounted on the first cover (11), wherein a plurality of optoelectronic elements (15) configured to emit light are attached to each of the at least two carriers (12), and
    a second cover (13) mounted on the at least two carriers (12), wherein the second cover (13) has at least partially a lower optical transmittance than the first cover (11) and/or the at least two carriers (12).
2. The optoelectronic apparatus (30) according to item 1, wherein the second cover (13) has the lower optical transmittance in a region (31) at an interface between two adjacent carriers (12) of the at least two carriers (12) compared to the optical transmittance in other regions (32).
3. The optoelectronic apparatus (30) according to item 1 or 2, wherein dots or a pattern are printed on the second cover (13), or the second cover (13) comprises light absorbing particles.

4. The optoelectronic apparatus (30) according to any one of the preceding items, wherein a gap (16) between two adjacent carriers (12) of the at least two carriers (12) is filled with a material (41) having an optical transmittance identical or similar to the optical transmittance of the at least two carriers (12) and/or a refraction index identical or similar to the refraction index of the at least two carriers (12).

5. An optoelectronic apparatus (40), comprising:
a transparent first cover (11), and
at least two carriers (12) mounted on the first cover (11), wherein
a plurality of optoelectronic elements (15) configured to emit light are attached to each of the at least two carriers (12), and
a gap (16) between two adjacent carriers (12) of the at least two carriers (12) is filled with a material (41) having an optical transmittance identical or similar to the optical transmittance of the two carriers (12) and/or a refraction index identical or similar to the refraction index of the two carriers (12).

6. The optoelectronic apparatus (40) according to item 5, further comprising a transparent second cover (13) mounted on the at least two carriers (12).

7. An optoelectronic apparatus (50), comprising:
a transparent first cover (11), and
at least two carriers (12) mounted on the first cover (11), wherein
a plurality of optoelectronic elements (15) configured to emit light are attached to each of the at least two carriers (12), and
the optical transmittance of each of the carriers (12) is varied in the direction (51) of a gap (16) between the respective carrier (12) and an adjacent carrier (12).

8. The optoelectronic apparatus (50) according to item 7, wherein the optical transmittance of each of the carriers (12) is increased in the direction (51) of the gap (16) between the respective carrier (12) and the adjacent carrier (12).

9. The optoelectronic apparatus (50) according to item 7 or 8, wherein the optical transmittance of each of the carriers (12) is varied by a perforation in the respective carrier (12) and/or a pattern printed on the respective carrier (12).

10. The optoelectronic apparatus (50) according to any one of the items 7 to 9, further comprising a transparent second cover (13) mounted on the at least two carriers (12).

11. The optoelectronic apparatus (30, 40, 50) according to any one of the preceding items, wherein the first cover (11) is made of a glass and/or a plastic material.

12. The optoelectronic apparatus (30, 40, 50) according to any one of the items 1, 6 and 10, wherein the second cover (13) is made of a glass, a carrier and/or a plastic material.

13. The optoelectronic apparatus (30, 40, 50) according to any one of the preceding items, wherein the optoelectronic apparatus (30, 40, 50) is one of a roof lining, a panoramic roof, a windscreen, a rear window and a side window for a vehicle.

14. A vehicle comprising an optoelectronic apparatus (30, 40, 50) according to any one of the preceding items.

15. A method for manufacturing an optoelectronic apparatus (30), comprising:
mounting at least two carriers (12) on a transparent first cover (11), wherein a plurality of optoelectronic elements (15) configured to emit light are attached to each of the at least two carriers (12), and
mounting a second cover (13) on the at least two carriers (12), wherein the second cover (13) has at least partially a lower optical transmittance than the first cover (11) and/or the at least two carriers (12).

16. A method for manufacturing an optoelectronic apparatus (40), comprising:
mounting at least two carriers (12) on a transparent first cover (11), wherein a plurality of optoelectronic elements (15) configured to emit light are attached to each of the at least two carriers (12), and
filling a gap (16) between two adjacent carriers (12) of the at least two carriers (12) with a material (41) having an optical transmittance identical or similar to the optical transmittance of the two carriers (12) and/or a refraction index identical or similar to the refraction index of the two carriers (12).

17. A method for manufacturing an optoelectronic apparatus (50), comprising:
mounting at least two carriers (12) on a transparent first cover (11), wherein a plurality of optoelectronic elements (15) configured to emit light are attached to each of the at least two carriers (12), and wherein the optical transmittance of each of the carriers (12) is varied in the direction of a gap between the respective carrier (12) and an adjacent carrier (12).

18. An optoelectronic apparatus (10), comprising:
a transparent first cover (11),
a first layer segment (1.1), in particular intermediate layer segment, arranged on the transparent first cover (11) and comprising at least one optoelectronic element (15)
a second layer segment (1.2), in particular intermediate layer segment, arranged on the transparent first cover (11) adjacent to the first layer segment (1.1) along a first direction (x),
wherein the first and the second layer segment (1.1, 1.2) comprise an approximately similar refractive index,
wherein the first and the second layer segment (1.1, 1.2) are joined together along the first direction (x) by a melted or dissolved and resolidified material (24).

19. The optoelectronic apparatus according to item 18, characterized in that
the melted and resolidified material (24) comprises or consist of the material of the first layer segment (1.1), the material of the second layer segment (1.2) or a combination of the material of the first and second layer segment (1.1, 1.2).

20. The optoelectronic apparatus according to item 18 or 19, characterized in that
the melted and resolidified material (24) comprises a refractive index similar to the first and/or second layer segment (1.1, 1.2).

21. The optoelectronic apparatus according to any one of the items 18 to 20,
characterized in that
the melted and resolidified material (24) is of a material different from the material of one of the first and second layer segment (1.1, 1.2).

22. Optoelectronic system (9) comprising an optoelectronic apparatus (10) according to any one of the items 18 to 21 arranged between two transparent plates, in particular glass plates.

23. Method for manufacturing an optoelectronic apparatus comprising the steps:
providing a temporary carrier layer (19), arranging a first layer segment (1.1) on the temporary carrier layer (19) comprising at least one optoelectronic element (15)

arranging a second layer segment (1.2) adjacent to the first layer segment (1.1) along a first direction (x) on the temporary carrier layer (19), wherein the first and second layer segment (1.1, 1.2) comprise an approximately similar refractive index joining the first and second layer segment (1.1, 1.2) together, such that a melted and resolidified material (24) is arranged between adjacent edges of the first and second layer segment (1.1, 1.2) along the first direction (x).

24. The method according to item 23, characterized in that
the step of arranging the second layer segment (1.2) adjacent to the first layer segment (1.1) along a first direction (x) comprises overlapping the first and second layer segment (1.1, 1.2) in an edge region of the first and second layer segment.

25. The method according to item 24, characterized in that
the step of joining the first and second layer segment (1.1, 1.2) together comprises heating the first and/or second layer segment such that the overlapping layer segment flows into a gap (16) between the first and second layer segment forming the melted and resolidified material (24).

26. The method according to item 23, characterized in that
the step of joining the first and second layer segment (1.1, 1.2) together comprises heating the first and/or second layer segment such that the melted and resolidified material (24) is formed of the material of the first and/or second layer segment.

27. The method according to item 23, characterized in that
the step of joining the first and second layer segment (1.1, 1.2) together comprises chemically dissolving the first and/or second layer segment such that the melted and resolidified material (24) is formed of the material of the first and/or second layer segment.

28. The method according to item 23, characterized in that
the method further comprises the steps:
arranging a third layer segment (1.3) adjacent to the first layer segment (1.1) along the first direction (x) on the temporary carrier layer (19) opposite to the second layer segment (1.2),
arranging a fourth layer segment (1.4) on top of the first, second and third layer segment,
wherein the first, the second, the third and the fourth layer segment comprise an approximately similar refractive index and optionally consist of a similar material.

29. The method according to item 28, characterized in that
the method further comprises the step:
joining the second, third and fourth layer segment together, such that a melted and resolidified material (24) is arranged between adjacent edges of the second, third and fourth layer segment, such that the first layer segment is covered with the second, third and fourth layer segment.

30. Method for manufacturing an optoelectronic apparatus comprising the steps:
providing a temporary carrier layer (19),
arranging a first layer segment (1.1) on the temporary carrier layer (19) comprising at least one optoelectronic element (15)

arranging a second layer segment (1.2) on the first layer segment (1.1) such that the second layer segment is overlapping at least one edge region of the first layer segment,
wherein the first and second layer segment comprise an approximately similar refractive index
joining the first and second layer segment together such that the second layer segment nestles up to the contour of the first layer segment.

31. The method according to item 30, characterized in that
the second layer segment (1.2) is completely overlapping the first layer segment (1.1).

32. The method according to item 31, characterized in that
the second layer segment (1.2) extends at least partially over the edges of the first layer (1.1).

33. An optoelectronic apparatus (10), comprising:
an at least partially transparent first cover (11),
a second cover (13)
at least one first layer segment (1.1), in particular intermediate layer segment, which is arranged between the first cover (11) and the second cover (13), and which carries an arrangement of a plurality of optoelectronic light sources (15),
wherein the arrangement of the plurality of optoelectronic light sources has a defined shape with a defined contour (26), and
wherein the first layer segment (1.1) has the same shape and the same contour (26) as the arrangement of the plurality of optoelectronic light sources (15).

34. The optoelectronic apparatus according to item 33, characterized in that
the optoelectronic apparatus comprises at least one second layer segment (1.2), in particular intermediate layer segment, arranged in the same layer as the at least one first layer segment (1.1) between the first cover (11) and the second cover (13), the second layer segment (1.2) comprises a second edge (27.2) which is complementary shaped to at least a first portion of the contour (26) of the first layer segment (1.1), and the second layer segment (1.2) is arranged adjacent to the first layer segment (1.1) such that the second edge (27.2) is adjacent to the first portion of the contour (26).

35. The optoelectronic apparatus according to item 34, characterized in that
the second layer segment (1.2) is formed by one of the following:
a molten material layer or
an adhesive layer, in particular a hot-melt adhesive layer or
a resin, such as PVB or EVA.

36. The optoelectronic apparatus according to item 34 or 35,
characterized in that
the second edge (27.2) is in contact with the first portion of the contour (26), in particular along the full length of the first portion of the contour (26).

37. The optoelectronic apparatus according to any one of the items 33 to 36,
characterized in that
the contour (26) and the second edge (27.2) are both closed in a circumferential direction (Y), and the second edge (27.2) is complementary shaped to the contour (26) along its complete circumferential length.

38. The optoelectronic apparatus according to any one of the items 33 to 37, characterized in that
the optoelectronic light sources (15) are equally distributed on the at least one first layer segment (1.1).

39. The optoelectronic apparatus according to any one of the items 33 to 38, characterized in that
the size of the first layer segment (1.1) is significantly smaller than the size of the first cover (11), in particular when seen in a top view of the optoelectronic apparatus (10).

40. The optoelectronic apparatus according to any one of the items 33 to 39, characterized in that
the first layer segment (1.1) comprises a surface side which extends along the contour (26) in a vertical direction, and the material of the first layer segment (1.1) on the surface side comprises at least one of the following:
scattering particles,
defects, and
voids.

41. The optoelectronic apparatus according to any one of the items 33 to 40, characterized in that
the optoelectronic apparatus further comprises at least one third layer segment (1.3), in particular intermediate layer segment, arranged in the same layer as the at least one first layer segment (1.1) between the first cover (11) and the second cover (13), the third layer segment comprises at least one conductor line, preferably two conductor lines, and a third edge (27.3) which is complementary shaped to at least a second portion of the contour (26) of the first layer segment (1.1), and wherein the third layer segment (1.3) is arranged adjacent to the first layer segment (1.1) such that the third edge (27.3) is adjacent to the second portion of the contour (26).

42. The optoelectronic apparatus according to item 41, characterized in that
the third layer segment (1.3) comprises a surface side which extends along the third edge (27.3) in a vertical direction, and the material of the third layer segment (1.3) on the surface side comprises at least one of the following:
scattering particles,
defects, and
voids.

43. The optoelectronic apparatus according to any one of the items 33 to 42, characterized in that
the first layer segment (1.1) and/or a second layer segment (1.2) and/or a third layer segment (1.3) are made of one piece, wherein a plurality of perforations (29) extends along the contour (26) of the first layer segment (1.1) to differentiate the layer segments from each other while the layer segments remain one piece.

44. The optoelectronic apparatus according to any one of the items 33 to 43, characterized in that
the first and the second layer segment (1.1, 1.2) and/or the first and the third layer segment (1.1, 1.3) have different refractive indices.

45. The optoelectronic apparatus according to any one of the items 33 to 44, characterized in that
at least one and preferably all of the layer segments consist of an at least partially transparent or a blackened material.

46. Method of manufacturing an optoelectronic apparatus comprising the steps:
providing at least one first layer segment (1.1), in particular intermediate layer segment, which carries an arrangement of a plurality of optoelectronic light sources (15),
wherein the arrangement of the plurality of optoelectronic light sources has a defined shape with a defined contour (26), and wherein the first layer segment (1.1) has the same shape and the same contour as the arrangement of the plurality of optoelectronic light sources (15),
providing an at least transparent first cover (11) and a second cover (13), and
arranging the first layer segment (1.1) between the first cover (11) and the second cover (13).

47. The method according to item 46, characterized in that
the step of providing at least one first layer segment (1.1) comprises a step of providing, in particular cutting or laser cutting, the first layer segment (1.1) out of a larger first layer (1), such that the first layer segment (1.1) has the same shape and the same contour as the arrangement of the plurality of optoelectronic light sources (15).

48. The method according to item 46 or 47, characterized in that
the method further comprises a step of
arranging a second layer segment (1.2) between the first cover (11) and the second cover (13), wherein a second edge (27.2) of the second layer segment (1.2) and the first portion of the contour (26) are adjacent to each other, and
wherein the second edge (27.2) is complementary shaped to at least the first portion of the contour (26) of the first layer segment (1.1).

49. The method according to item 48, characterized in that
the second layer segment (1.2) is arranged between the first cover (11) and the second cover (13) before the first layer segment (1.1), or alternatively, the first layer segment (1.1) is arranged between the first cover (11) and the second cover (13) before the second layer segment (1.2).

50. The method according to any one of the items 46 to 49, characterized in that
the step of providing the first layer segment (1.1) comprises a step of exposing a surface side, which extends along the contour (26) of the first layer segment (1.1) in a vertical direction, to laser light, wherein, optionally the step of exposing the surface side to laser light is a laser cutting step.

51. The method according to any one of the items 46 to 50, characterized in that the method further comprises a step of providing scattering particles on a surface side, which extends along the contour (26) of the first layer segment (1.1) in a vertical direction.
52. The method according to any one of the items 46 to 51,
characterized in that
the method further comprises a step of
providing a third layer segment (1.3) in the same layer as the at least one first layer segment (1.1) between the first cover (11) and the second cover (13), the third layer segment comprises at least one conductor line, preferably two conductor lines, and a third edge (27.3) which is complementary shaped to at least a second portion of the contour (26) of the first layer segment (1.1).
53. The method according to item 52,
characterized in that
the method further comprises a step of
arranging the third layer segment (1.3) between the first cover (11) and the second cover (13) adjacent to the first layer segment (1.1) such that the third edge (27.3) is adjacent to the second portion of the contour (26).
54. The method according to item 52 or 53,
characterized in that
the method further includes a step of providing scattering elements, defects and/or voids in a surface side of the third layer segment (1.3), the surface side extending along the third edge (27.3) of the third layer segment in a vertical direction.
55. The method according to any one of the items 52 to 54,
characterized in that
the method further includes a step of producing a sequence of perforations (29) in the third layer segment (1.3), wherein the sequence of perforations extends adjacent to the third edge (27.3).

The description with the aid of the exemplary embodiments does not restrict the various embodiments shown to these. Rather, the disclosure depicts several aspects that can be combined with one another. The various items shown above also illustrate this.

The invention thus encompasses any features and any combination of features, in particular including any combination of features in the items and claims, even if this feature or this combination is not explicitly specified in the exemplary embodiments.

The invention claimed is:
1. An optoelectronic apparatus comprising:
a transparent first cover;
at least two carriers mounted on the first cover, wherein a plurality of optoelectronic elements configured to emit light are attached to each of the at least two carriers; and
a second cover mounted on the at least two carriers, wherein the second cover has at least partially a lower optical transmittance than the first cover and/or the at least two carriers.
2. The optoelectronic apparatus according to claim 1, wherein the second cover has the lower optical transmittance in a region at an interface between two adjacent carriers of the at least two carriers compared to the optical transmittance in other regions.
3. The optoelectronic apparatus according to claim 1, wherein dots or a pattern are printed on the second cover, or the second cover comprises light absorbing particles.
4. The optoelectronic apparatus according to claim 1, wherein a gap between two adjacent carriers of the at least two carriers is filled with a material having an optical transmittance identical or similar to the optical transmittance of the at least two carriers and/or a refraction index identical or similar to the refraction index of the at least two carriers.
5. The optoelectronic apparatus according to claim 1, wherein the first cover is made of a glass and/or a plastic material.
6. The optoelectronic apparatus according to claim 1, wherein the second cover is made of a glass, a carrier, and/or a plastic material.
7. The optoelectronic apparatus according to claim 1, wherein the optoelectronic apparatus comprises a roof lining, a panoramic roof, a windscreen, a rear window, or a side window for a vehicle.
8. A vehicle comprising an optoelectronic apparatus according to claim 1.
9. A window of a vehicle, comprising:
a transparent first cover;
at least two carriers mounted on the first cover;
wherein a plurality of optoelectronic elements configured to emit light are attached to each of the at least two carriers; and
wherein a gap between two adjacent carriers of the at least two carriers is filled with a material having an optical transmittance identical or similar to the optical transmittance of the two carriers and/or a refraction index identical or similar to the refraction index of the two carriers.
10. The window according to claim 9, further comprising a transparent second cover mounted on the at least two carriers.
11. An optoelectronic apparatus comprising:
a transparent first cover;
at least two carriers mounted on the first cover;
wherein a plurality of optoelectronic elements configured to emit light are attached to each of the at least two carriers; and
wherein the optical transmittance of each of the carriers is varied in the direction of a gap between the respective carrier and an adjacent carrier.
12. The optoelectronic apparatus according to claim 11, wherein the optical transmittance of each of the carriers is increased in the direction of the gap between the respective carrier and the adjacent carrier.
13. The optoelectronic apparatus according to claim 11, wherein the optical transmittance of each of the carriers is varied by a perforation in the respective carrier and/or a pattern printed on the respective carrier.
14. The optoelectronic apparatus according to claim 11, further comprising a transparent second cover mounted on the at least two carriers.
15. The optoelectronic apparatus according to claim 11, wherein the first cover is made of a glass and/or a plastic material.
16. The optoelectronic apparatus according to claim 11, wherein the second cover is made of a glass, a carrier, and/or a plastic material.
17. The optoelectronic apparatus according to claim 11, wherein the optoelectronic apparatus comprises a roof lining, a panoramic roof, a windscreen, a rear window, or a side window for a vehicle.
18. A vehicle comprising the optoelectronic apparatus according to claim 11.
19. A method for manufacturing an optoelectronic apparatus, comprising:

mounting at least two carriers on a transparent first cover, wherein a plurality of optoelectronic elements configured to emit light are attached to each of the at least two carriers; and mounting a second cover on the at least two carriers, wherein the second cover has at least partially a lower optical transmittance than the first cover and/or the at least two carriers.

20. A method for manufacturing a window of a vehicle, comprising:

mounting at least two carriers on a transparent first cover, wherein a plurality of optoelectronic elements configured to emit light are attached to each of the at least two carriers; and filling a gap between two adjacent carriers of the at least two carriers with a material having an optical transmittance identical or similar to the optical transmittance of the two carriers and/or a refraction index identical or similar to the refraction index of the two carriers.

21. A method for manufacturing an optoelectronic apparatus, comprising:

mounting at least two carriers on a transparent first cover;

wherein a plurality of optoelectronic elements configured to emit light are attached to each of the at least two carriers; and wherein the optical transmittance of each of the carriers is varied in the direction of a gap between the respective carrier and an adjacent carrier.

22. An optoelectronic apparatus, comprising:

a transparent first cover, at least two carriers mounted on the first cover, wherein a plurality of optoelectronic elements configured to emit light are attached to each of the at least two carriers, and a second cover mounted on the at least two carriers, wherein the second cover has at least partially a lower optical transmittance than the first cover and/or the at least two carriers, and/or a transparent first cover, a first layer segment, in particular intermediate layer segment, arranged on the transparent first cover and comprising at least one optoelectronic element, a second layer segment, in particular intermediate layer segment, arranged on the transparent first cover adjacent to the first layer segment along a first direction, wherein the first and the second layer segment comprise an approximately similar refractive index, wherein the first and the second layer segment are joined together along the first direction by a melted or dissolved and resolidified material, and/or an at least partially transparent first cover, a second cover, at least one first layer segment, in particular intermediate layer segment, which is arranged between the first cover and the second cover, and which carries an arrangement of a plurality of optoelectronic light sources, wherein the arrangement of the plurality of optoelectronic light sources has a defined shape with a defined contour, and wherein the first layer segment has the same shape and the same contour as the arrangement of the plurality of optoelectronic light sources.

* * * * *